(12) United States Patent
Nose

(10) Patent No.: US 10,910,668 B2
(45) Date of Patent: Feb. 2, 2021

(54) BATTERY SYSTEM AND VEHICLE EQUIPPED WITH BATTERY SYSTEM

(71) Applicant: TOYOTA JIDOSHA KABUSHIKI KAISHA, Toyota (JP)

(72) Inventor: Masafumi Nose, Susono (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 204 days.

(21) Appl. No.: 16/033,501

(22) Filed: Jul. 12, 2018

(65) Prior Publication Data

US 2019/0027784 A1 Jan. 24, 2019

(30) Foreign Application Priority Data

Jul. 18, 2017 (JP) .................................. 2017-139360

(51) Int. Cl.
*H01M 10/00* (2006.01)
*H01M 10/0562* (2010.01)
(Continued)

(52) U.S. Cl.
CPC ....... *H01M 10/0562* (2013.01); *B60L 3/0046* (2013.01); *B60L 58/12* (2019.02); *G01R 31/367* (2019.01); *G01R 31/392* (2019.01); *H01M 4/382* (2013.01); *H01M 10/052* (2013.01); *H01M 10/0525* (2013.01); *H01M 10/441* (2013.01); *H01M 10/48* (2013.01); *B60L 2240/547* (2013.01); *B60L 2240/549* (2013.01);
(Continued)

(58) Field of Classification Search
CPC ............. B60L 2240/547; B60L 3/0046; G01R 31/3842; G01R 31/367; H01M 2300/0068; H01M 10/441
See application file for complete search history.

(56) References Cited

U.S. PATENT DOCUMENTS

| 2015/0301115 A1 | 10/2015 | Ohkawa et al. |
| 2016/0036091 A1 | 2/2016 | Ohtomo et al. |
| 2016/0218544 A1* | 7/2016 | Ogihara ............. G01R 31/3828 |

FOREIGN PATENT DOCUMENTS

| JP | 2010-066232 A | 3/2010 |
| JP | 2016-012459 A | 1/2016 |

(Continued)

*Primary Examiner* — Cynthia H Kelly
*Assistant Examiner* — Monique M Wills
(74) *Attorney, Agent, or Firm* — Sughrue Mion, PLLC

(57) ABSTRACT

A battery system 5 is provided with an all-solid-state battery 10, a voltage detection device that detects voltage of the all-solid-state battery, a current detection device 66 that detects current flowing from the all-solid-state battery, and a control device 50 that controls the all-solid-state battery. A negative electrode active material layer is composed of lithium metal. The control device calculates the amount of change in charging rate as a first estimated value, based on an integrated value obtained by integrating detected current over a prescribed calculation period, calculates the amount of change in charging rate as a second estimated value, based on voltage detected during the calculation period as a second estimated value, and judges that an abnormality has occurred in the all-solid-state battery when the difference between the first estimated value and the second estimated value is equal to or greater than a predetermined reference value.

16 Claims, 13 Drawing Sheets

(51) Int. Cl.
  *H01M 10/48*      (2006.01)
  *H01M 4/38*       (2006.01)
  *H01M 10/0525*    (2010.01)
  *B60L 58/12*      (2019.01)
  *B60L 3/00*       (2019.01)
  *H01M 10/44*      (2006.01)
  *G01R 31/367*     (2019.01)
  *G01R 31/392*     (2019.01)
  *H01M 10/052*     (2010.01)
  *G01R 31/3842*    (2019.01)

(52) U.S. Cl.
  CPC ....... *B60L 2260/44* (2013.01); *G01R 31/3842* (2019.01); *H01M 2220/20* (2013.01); *H01M 2300/0068* (2013.01)

(56) References Cited

FOREIGN PATENT DOCUMENTS

| | | |
|---|---|---|
| JP | 2016-035867 A | 3/2016 |
| JP | 2016-100088 A | 5/2016 |
| WO | 2014/115294 A1 | 7/2014 |

\* cited by examiner

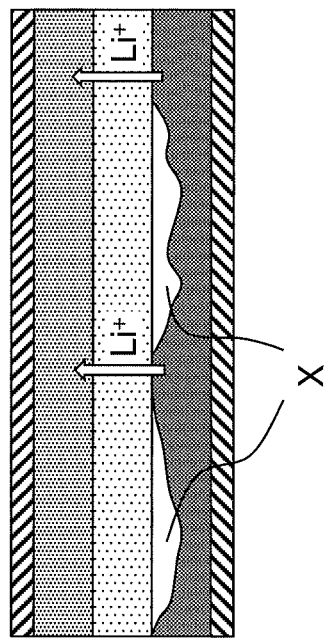
FIG. 5B
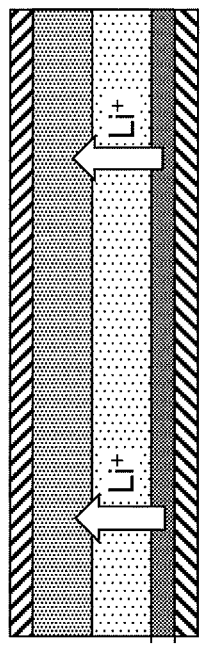
FIG. 5C
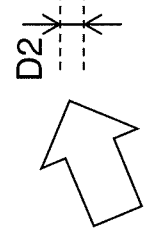
FIG. 5A
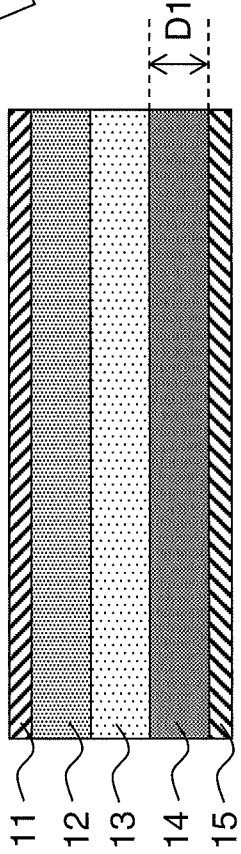

BATTERY SYSTEM AND VEHICLE EQUIPPED WITH BATTERY SYSTEM

TECHNICAL FIELD

The present invention relates to a battery system and a vehicle equipped with a battery system.

BACKGROUND ART

Lithium ion secondary batteries are known in the prior art that have at least one battery element provided with a positive electrode current collector layer, positive electrode active material layer, electrolyte layer, negative electrode active material layer and negative electrode current collector layer in that order (Patent Documents 1 to 4). These lithium ion secondary batteries are used in various applications due to their high energy density.

In addition, all-solid-state batteries that use a solid electrolyte having lithium ion conductivity are also known as lithium ion secondary batteries (Patent Documents 1 to 3). The use of a solid electrolyte for the electrolyte of an all-solid-state battery instead of a conventionally used flammable organic solvent makes it possible to improve safety as well as enhance energy density.

Moreover, the use of lithium metal has been proposed for the negative electrode active material of an all-solid-state battery (Patent Documents 2 and 3). The use of lithium metal for the negative electrode active material in this manner makes it possible to not only further enhance energy density, but also reduce the overall weight of the battery.

PRIOR ART DOCUMENTS

Patent Documents

[Patent Document 1] Japanese Unexamined Patent Publication No. 2016-100088
[Patent Document 2] Japanese Unexamined Patent Publication No. 2016-35867
[Patent Document 3] Japanese Unexamined Patent Publication No. 2016-12459
[Patent Document 4] Japanese Unexamined Patent Publication No. 2010-66232

DISCLOSURE OF THE INVENTION

Problems to be Solved by the Invention

In this regard, as was previously described, in the case of all-solid-state batteries using lithium metal for the negative electrode active material, partial defects may occur in the negative electrode active material layer in the vicinity of the contact surface between the negative electrode active material layer and the solid electrolyte layer.

More specifically, in the case of these all-solid-state batteries, when charging and discharging are repeated, deposition and dissolution of lithium metal are repeated in the negative electrode active material layer. Dissolution of lithium metal progresses nearly uniformly over the entire contact surface between the negative electrode active material layer and solid electrolyte layer, when the output of an actuator connected to the all-solid-state battery is low, resulting in discharge proceeding slowly. However, when the output of an actuator connected to the all-solid-state battery is high, resulting in discharge proceeding rapidly, local dissolution of lithium metal sometimes proceeds considerably at the contact surface between the negative electrode active material layer and solid electrolyte layer. As a result, a partial defect occurs in the negative electrode active material layer in the vicinity of the contact surface between the negative electrode active material layer and the solid electrolyte layer.

When a partial defect occurs in the negative electrode active material layer in the vicinity of the contact surface in this manner, conduction of lithium ions through the solid electrolyte layer no longer occurs in the region where the defect has occurred (and this state is referred to as an "ion pathway interruption"). Accumulation of these ion pathway interruptions leads to a decrease in output of the all-solid-state battery. Thus, it is necessary to detect such ion pathway interruptions.

With the foregoing in view, an object of the present invention is to detect ion pathway interruptions in an all-solid-state battery in which the negative electrode active material layer contains lithium metal.

Solution to Problem

The present invention was made so as to solve the above problem and has as its gist the following.

(1) A battery system, comprising:
an all-solid-state battery at least having one battery element obtained by laminating a positive electrode current collector layer, a positive electrode active material layer, a solid electrolyte layer, a negative electrode current collector layer and a negative electrode active material layer in that order;
a voltage detection device that detects voltage of the all-solid-state battery;
a current detection device that detects current flowing from the all-solid-state battery; and
a control device that controls the all-solid-state battery, wherein,
the negative electrode active material is composed of lithium metal, and
when the amount of change during a prescribed calculation period in a charging parameter that changes corresponding to the charge capacity of the all-solid-state battery is defined as an amount of change of the parameter, the control device is configured to calculate the amount of change in the parameter as a first estimated value, based on an integrated value obtained by integrating current detected by the current detection device over the calculation period, to calculate the amount of change in the parameter as a second estimated value based on voltage detected by the voltage detection device during the calculation period, and to judge that an abnormality has occurred in the all-solid-state battery when the difference between the first estimated value and the second estimated value is equal to or greater than a predetermined reference value.

(2) A battery system, comprising:
an all-solid-state battery at least having one battery element obtained by laminating a positive electrode current collector layer, a positive electrode active material layer, a solid electrolyte layer, a negative electrode current collector layer and a negative electrode active material layer in that order;
a voltage detection device that detects voltage of the all-solid-state battery;
a current detection device that detects current flowing from the all-solid-state battery; and
a control device that controls the all-solid-state battery, wherein, the negative electrode active material is composed of lithium metal, and the control device is configured to calculate the value of a charging parameter, that changes corresponding to the charge capacity of the all-solid-state battery, when a prescribed calculation period has elapsed, as a first estimated value, based on an integrated value obtained by integrating current detected by the current detection device over the prescribed calculation period, to calculate the value of the charging parameter when a prescribed calculation period has elapsed, as a second estimated value, based on voltage detected by the voltage detection device during the calculation period, and to judge that an abnormality has occurred in the all-solid-state battery when the difference between the first estimated value and the second estimated value is equal to or greater than a predetermined reference value.

(3) The battery system according to above (1) or (2), wherein the control device is configured to calculate one of the first estimated value and the second estimated value, using a standard correlation, which represents the relationship between the charging rate of the all-solid state battery and the open circuit voltage of the all-solid-state battery when an ion pathway interruption abnormality is not occurring in the all-solid-state battery, and to calculate the other of the first estimated value and the second estimated value without using the standard correlation.

(4) The battery system according to above (3), wherein the control device is configured to update the standard correlation according to the degree of deterioration of the all-solid-state battery.

(5) The battery system according to any of above (1) to (4), wherein the charging parameter is the charging rate of the all-solid-state battery.

(6) The battery system according to any of above (1) to (4), wherein the charging parameter is the open circuit voltage of the all-solid-state battery.

(7) A vehicle equipped with the battery system according to any of above (1) to (6), comprising a motor for driving the vehicle, wherein the all-solid-state battery is connected to the motor, and the starting time of the calculation period is the time at which the vehicle ignition switch is ON and the vehicle is not being driven by the motor.

(8) A vehicle equipped with the battery system according to any of above (1) to (6), comprising a vehicle control device that controls each constituent of the vehicle, wherein the vehicle control device is configured to control the constituents so that the output of the all-solid-state battery is restricted, when an abnormality has been judged to have occurred in the all-solid-state battery, in comparison with when an abnormality has been judged to not have occurred.

(9) A vehicle equipped with the battery system according to any of above (1) to (6), comprising a vehicle control device that controls each constituent of the vehicle, wherein the vehicle control device is configured to control the constituents so that the all-solid-state battery is charged when an abnormality has been judged to have occurred in the all-solid-state battery.

Effects of the Invention

According to the present invention, ion pathway interruptions can be detected in an all-solid-state battery in which the negative electrode active material contains lithium metal.

BRIEF DESCRIPTION OF THE DRAWINGS

FIGS. 5A-5C is a schematic cross-sectional view of each battery element before and after discharge of an all-solid-state battery.

BEST MODE FOR CARRYING OUT THE INVENTION

The following provides a detailed explanation of embodiments of the present invention with reference to the drawings. Furthermore, the same reference symbols are used to indicate the same constituents.

<Vehicle Composition>

Figure 1:
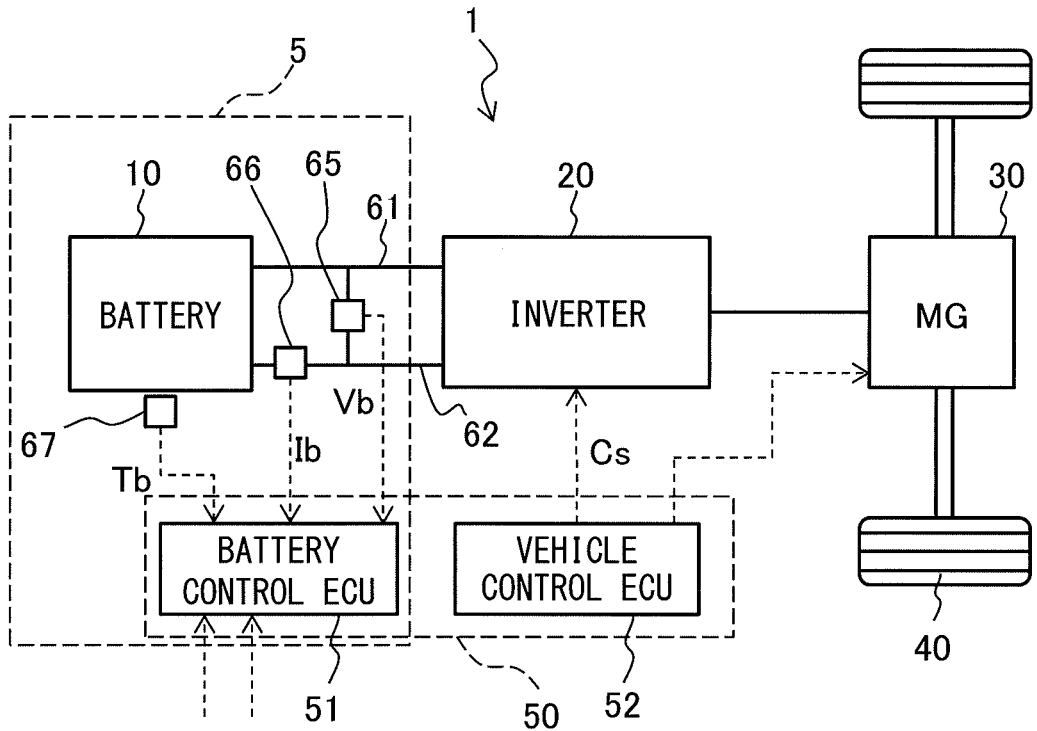
FIG. 1 is a block diagram schematically representing the composition of the power train of a vehicle according to a first embodiment.

FIG. 1 is a block diagram schematically representing the composition of the power train of a vehicle according to a first embodiment. As shown in FIG. 1, a vehicle 1 is provided with a battery system 5 having an all-solid-state battery 10, an inverter 20, a motor generator 30, wheels 40 and an electronic control unit (ECU) 50.

The all-solid-state battery 10 is a rechargeable direct current power source, the specific composition of which is subsequently described. The all-solid-state battery 10 is connected to the inverter 20 through a positive electrode line 61 and a negative electrode line 62. When the vehicle is driven by the motor generator 30, the all-solid-state battery 10 outputs direct current to the inverter 20. On the other hand, during regenerative power generation by the motor generator 30, regenerative current is input to the all-solid-state battery 10 from the inverter 20.

The inverter 20 is composed of a three-phase bridge circuit. When the vehicle is driven by the motor generator 30, the inverter 20 converts direct current from the all-solid-state battery 10 to three-phase alternating current, and outputs that current to the motor generator 30. During conversion of direct current to alternating current, the inverter 20 adjusts the frequency and the amount of current based on a signal Cs from the ECU 50, and controls the rotating speed and drive torque of the motor generator 30 in accordance therewith. On the other hand, during regenerative power generation by the motor generator 30, the inverter 20 converts alternating current from the motor generator 30 to direct current to charge the all-solid-state battery 10.

The motor generator 30 is a three-phase alternating current generator. The motor generator 30 drives the wheels 40 coupled to the motor generator 30 with the three-phase alternating current flowing from the inverter 20. In addition, the motor generator 30 also generates electricity as a result of being driven by the wheels 40, and the generated regenerative power is output to the inverter 20.

The ECU 50 is provided with a battery control ECU 51 and a vehicle control ECU 52. The battery control ECU 51 functions as a control device that performs abnormality diagnosis and other control of the all-solid-state battery 10, while the vehicle control ECU 52 functions as a control device that controls each constituent related to driving the vehicle 10 (such as the inverter 20 or the motor generator 30). The battery control ECU 51 composes a portion of the battery system 5. The vehicle control ECU 52 calculates the target torque and target rotating speed of the motor generator 30 based on such factors as the amount of accelerator or brake pedal depression, while also controlling the inverter 20 based on the calculated target torque and target rotating speed.

In addition, the battery system 5 is provided with a voltage sensor (voltage detection device) 65 that detects a voltage Vb between the positive electrode line 61 and the negative electrode line 62, a current sensor (current detection device) 66 that detects a current Ib flowing through the negative electrode line 62, and a temperature sensor 67 that detects a temperature Tb of the all-solid-state battery 10. This voltage sensor 65, current sensor 66 and temperature sensor 67 are connected to the battery control ECU 51. Furthermore, the voltage sensor 65 may be any type of sensor provided it is able to detect the closed circuit voltage (CCV), which is voltage between terminals of the all-solid-state battery 10 when current is flowing from the all-solid-state battery 10. In addition, the voltage sensor 65 may detect the voltage of each battery element that composes the all-solid-state battery 10 or may detect the voltage of a module composed of a plurality of battery elements. In addition, the current sensor 66 may be any type or sensor, such as a current sensor built into the all-solid-state battery 10, provided it is able to detect current flowing from the all-solid-state battery 10.

<Control Device Functions>

Figure 2:
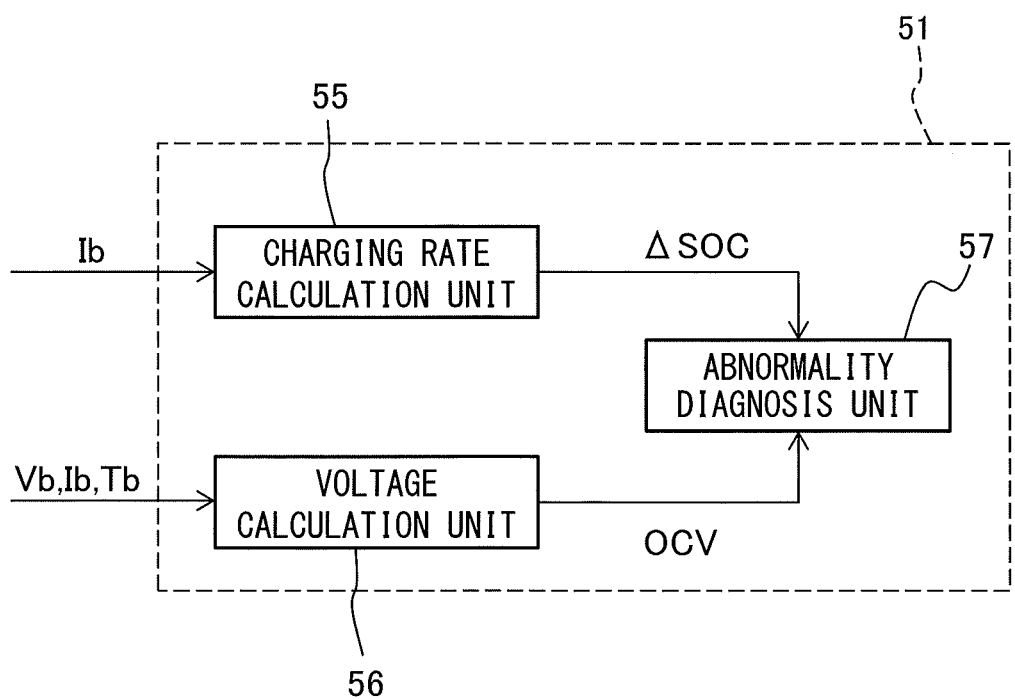
FIG. 2 is a functional block diagram of an ECU for battery control.

FIG. 2 is a functional block diagram of the battery control ECU 51 that functions as a control device for controlling the all-solid-state battery 10. As shown in FIG. 2, the battery control ECU 51 is provided with a charging rate calculation unit 55, a voltage calculation unit 56 and an abnormality diagnosis unit 57.

The charging rate calculation unit 55 calculates the amount of change in the state of charge (SOC), which indicates the ratio of the current residual capacity to the full charge capacity of the solid-state-battery 10 (charging rate). In the present embodiment, the charging rate calculation unit 55 calculates the amount of change in SOC during a prescribed time period, based on an integrated value obtained by integrating the current Ib detected by the current sensor 66 over that prescribed time period. More specifically, the ratio of the integrated value of the current Ib to the full charge capacity is calculated as the amount of change in SOC.

The voltage calculation unit 56 calculates the open circuit voltage (OCV), which is the voltage between the terminals of the all-solid-state battery 10 when current is not flowing from the all-solid-state battery 10. Alternatively, the voltage calculation unit 56 may also calculate the OCV of a part of battery elements that compose the all-solid-state battery 10.

In the present embodiment, the voltage calculation unit 56 calculates OCV of the all-solid-state battery 10, based on the voltage Vb detected by the voltage sensor 65, the current Ib detected by the current sensor 66, and the temperature Tb detected by the temperature sensor 67. The following provides a brief explanation of a specific example of a method used by the voltage detection unit 56 to calculate OCV of the all-solid-state battery 10.

When current flows from the all-solid-state battery 10, a change occurs in the voltage relative to the voltage (OCV) when current is not flowing from the all-solid-state battery, due to the internal resistance of the all-solid-state battery 10. When the change in voltage at this time is defined as $\Delta V$, then the relationship between OCV and CCV can be expressed with the following equation (1).

$$OCV = CCV + \Delta V \qquad (1)$$

Here, since CCV is the voltage when current flows from the all-solid-state battery 10, CCV is equal to the voltage Vb detected by the voltage sensor 65. Thus, OCV can be calculated if it were possible to determine the amount of the voltage change $\Delta V$ attributable to internal resistance.

Figure 3:
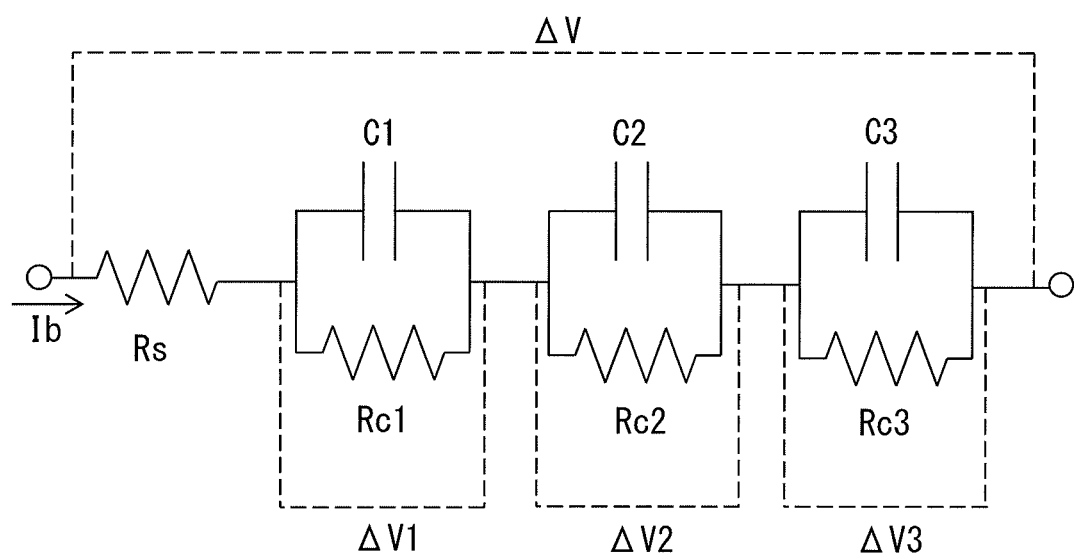
FIG. 3 is a drawing showing an equivalent circuit model of an all-solid-state battery.

The amount of voltage change $\Delta V$ attributable to internal resistance is calculated by using an equivalent circuit model of each battery element as shown in FIG. 3. In the equivalent circuit model shown in the drawing, Rs represents the resistance of the electrolyte, C1 to C3 represent the electrostatic capacity of the electric double layer of each battery element, and Rc1 to Rc3 represent the electrical charge transfer resistance on the electrode of each battery element.

The electrolyte resistance Rs changes according to the temperature of the all-solid-state battery 10. Thus, the relationship between the temperature Tb of the all-solid-state battery 10 and the electrolyte resistance Rs is preliminarily determined and stored in the battery control ECU 51 in the form of a map. During vehicle operation, the electrolyte resistance Rs is calculated, using the aforementioned map, based on the temperature Tb detected by the temperature sensor 67.

The electrostatic capacity C and the electrical charge transfer resistance Rc of each electric double layer vary according to the temperature of the all-solid-state battery 10 and SOC. Thus, the relationships thereof are preliminarily determined and stored in the battery control ECU 51 in the form of a map. During vehicle operation, electrostatic capacity C and electrical charge transfer resistance Rc are calculated, using the aforementioned map, based on the temperature Tb detected by the temperature sensor 67 and an estimated value of SOC. Furthermore, the estimated value of SOC is calculated based on, for example, the integrated value of current detected by the current sensor 66 as will be subsequently described.

According to the equivalent circuit model shown in FIG. 3, the voltage change $\Delta V$ can be calculated using the following equation (2). Furthermore, in equation (2), $\Delta V1$, $\Delta V2$ and $\Delta V3$ represent the voltage change in each RC parallel circuit.

$$\Delta V = Ib \cdot Rs + \Delta V1 + \Delta V2 + \Delta V3 \qquad (2)$$

The relationship of equation (3) is valid between current I (equivalent to Ib) and voltage V (equivalent to ΔV1 to ΔV3) of each RC parallel circuit. Furthermore, in equation (3), resistance R is equivalent to charge transfer resistances Rc1 to Rc3, and capacity C is equivalent to electrostatic capacities C1 to C3.

$$1C(I-V/R)=dV/dt \qquad (3)$$

Thus, ΔV1 to ΔV3 can be calculated by solving the differential equation of equation (3), and ΔV can be calculated by substituting the values of ΔV1 to ΔV3 into equation (2). OCV is then calculated by substituting the value of ΔV calculated in this manner into equation (1).

Note that, the method used to calculate OCV of the all-solid-state battery 10 is not limited to the aforementioned method, but rather various methods known in the prior art can be used. Thus, for example, OCV of the all-solid-state battery 10 may be calculated using an equation obtained by modeling the operation of the all-solid-state battery 10. Note that, the voltage Vb detected by the voltage sensor 65, the current Ib detected by the current sensor 66, and the temperature Tb detected by the temperature sensor 67 are at least used to calculate OCV.

<All-Solid-State Battery Composition and Charge-Discharge Mechanism>

Figure 4:
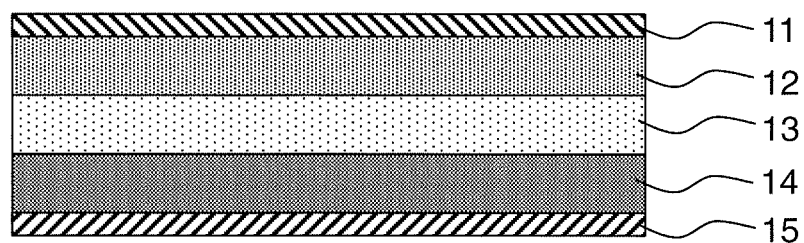
FIG. 4 is a schematic cross-sectional view of each battery element that composes an all-solid-state battery.

Next, an explanation is provided of the composition of the all-solid-state battery 10 with reference to FIG. 4. FIG. 4 is a schematic cross-sectional view of each battery element of the all-solid-state battery 10. The all-solid-state battery 10 has at least one battery element formed as shown in FIG. 4.

As shown in FIG. 4, each battery element of the all-solid-state battery 10 is formed by laminating a positive electrode current collector layer 11, a positive electrode active material layer 12, a solid electrolyte layer 13, a negative electrode active material layer 14 and a negative electrode current collector layer 15 in that order. The positive electrode current collector layer 11, the positive electrode active material layer 12, the solid electrolyte layer 13, the negative electrode active material layer 14 and the negative electrode current collector layer 15 are each formed with solid materials.

The positive electrode current collector layer 11 has a positive electrode current collector and has the function of collecting current from the positive electrode active material layer 12. A material such as aluminum, SUS, nickel, iron or titanium can be used for the material of the positive electrode current collector. In addition, examples of the form of the positive electrode current collector include foil, sheet and mesh.

The positive electrode active material layer 12 contains a positive electrode active material. In addition, the positive electrode active material layer 12 may also further contain a solid electrolyte, conducting agent or binder in addition to the positive electrode active material.

There are no particular limitations on the positive electrode active material of the positive electrode active material layer 12 provided it can be typically used in a sulfide solid-state battery, and examples thereof include layered, olivine-based and spinel-type compounds. Specific examples thereof include lithium cobalt oxide ($LiCoO_2$), lithium nickel oxide ($LiNiO_2$), lithium manganese oxide ($LiMnO_2$), lithium nickel manganese cobalt oxide ($LiNi_{1-y-z}Co_yMn_zO_2$) such as $LiNi_{1/3}Co_{1/3}Mn_{1/3}O_2$), lithium nickel cobalt oxide ($LiNi_{1-x}Co_xO_2$), lithium nickel manganese oxide ($LiNi_{1-x}Mn_xO_2$), lithium manganese oxide spinel ($LiMn_2O_4$), lithium manganese oxide compounds ($Li_{1+x}M_yMn_{2-x-y}O_4$, wherein M=Al, Mg, Fe, Cr, Co, Ni or Zn), lithium metal phosphates ($LiMPO_4$, wherein M=Fe, Mn, Co or Ni), lithium metal fluorophosphates ($Li_2MPO_4F$, wherein M=Fe, Mn Co or Ni), lithium metal phosphates ($Li_2MP_2O_7$, wherein M=Fe, Mn, Co or Ni), and lithium titanate ($Li_xTiO_y$). Other examples include lithium sulfide ($Li_2S$), lithium polysulfide ($Li_xS$: wherein $0<x<2$), sulfur (S) and titanium sulfide ($TiS_2$).

Although there are no particular limitations on the solid electrolyte able to be used in the positive electrode active material layer 12, examples of materials that can be used include the same materials as in the sulfide solid electrolyte material used in the solid electrolyte layer 13 to be subsequently described, oxide-based amorphous solid electrolytes and crystalline oxides.

Examples of conducting agents able to be used in the positive electrode active material layer include metal materials and carbon materials such as VGCF, carbon black or graphite. Examples of binders able to be used in the positive electrode active material in embodiments of the present invention include polytetrafluoroethylene, styrene butadiene rubber, amine-modified butyl rubber (ABR) and polyvinylidene fluoride (PVDF).

The solid electrolyte layer 13 normally has a sulfide solid electrolyte having elemental sulfur as the main anion element thereof. Examples of materials of the sulfide solid electrolyte layer include $Li_2S$—$P_2S_5$, $Li_2S$—$P_2S_5$—LiI, $Li_2S$—$P_2S_5$—LiCl, $Li_2S$—$P_2S_5$—LiBr, $Li_2S$—$P_2S_5$—LiBr—LiI, $Li_2S$—$P_2S_5$—$Li_2O$, $Li_2S$—$P_2S_5$—$Li_2O$—LiI, $Li_2S$—$SiS_2$, $Li_2S$—$SiS_2$—LiI, $Li_2S$—$SiS_2$—LiBr, $Li_2S$—$SiS_2$—LiCl, $Li_2S$—$SiS_2$—$B_2S_3$—LiI, $Li_2S$—$SiS_2$—$P_2S_5$—LiI, $Li_2S$—$B_2S_3$, $Li_2S$—$P_2S_5$—$Z_mS_n$ (wherein, m and n represent positive numbers and Z represents any of Ge, Zn or Ga), $Li_2S$—$GeS_2$, $Li_2S$—$SiS_2$—$Li_3PO_4$, $Li_2S$—$SiS_2$—$Li_xMO_y$ (wherein, x and y represent positive numbers and M represents any of P, Si, Ge, B, Al, Ga or In) and $Li_{10}GeP_2S_{12}$. Among these, $Li_2S$—$P_2S_5$—LiBr—LiI is preferable from the viewpoint of demonstrating high ionic conductivity. In addition, sulfide solid electrolyte particles preferably do not contain metals such as Ge or Si since metal is used as a negative electrode active material as subsequently described. This is the result of improvement of reduction resistance. In addition, the sulfide solid electrolyte may be amorphous, crystalline or glass-ceramic.

The negative electrode active material layer 14 is composed of lithium metal used as a negative electrode active material.

The negative electrode current collector layer 15 has a negative electrode current collector and has the function of collecting current from the negative electrode active material layer 14. Examples of materials of the negative electrode current collector layer include copper in addition to materials of the positive electrode current collector layer. The same form as that of the previously described positive electrode current collector can be used for the form of the negative electrode current collector.

Note that, in the case the all-solid-state battery 10 has a plurality of battery elements, adjacent battery elements may employ a composition in which they share a current collector layer. More specifically, in the case the all-solid-state battery 10 has a plurality of battery elements, the all-solid-state battery 10 may employ a monopolar composition in which adjacent battery elements share a positive electrode current collector layer or negative electrode current collector layer, and more specifically, may employ a composition in which, for example, a positive electrode current collector layer, positive electrode active material layer, solid electrolyte layer, negative electrode active material layer, negative electrode current collector layer, negative electrode active material layer, solid electrolyte layer, positive electrode active material layer and positive electrode current collector layer are laminated in that order, and has two battery elements sharing the negative electrode current collector layer. In addition, in the case the all-solid-state battery 10 has a plurality of battery elements, the all-solid-state battery 10 may employ a bipolar composition in which adjacent battery elements share a current collector layer functioning as both a positive electrode current collector layer and negative electrode current collector layer, and more specifically, may employ a composition in which, for example, a positive electrode current collector layer, positive electrode active material layer, solid electrolyte layer, negative electrode active material layer, combination negative electrode/positive electrode current collector layer, positive electrode active material layer, solid electrolyte layer, negative electrode active material layer and negative electrode current collector layer are laminated in that order, and has two battery elements sharing a current collector layer functioning as a combination negative electrode/positive electrode current collector layer.

Next, an explanation is provided of the charge-discharge mechanism in the all-solid-state battery 10 provided with a cell composed in this manner. When the all-solid-state battery 10 is charged, lithium contained in the positive electrode active material layer 12 emits electrons into the positive electrode current collector layer 11 resulting in the formation of lithium ions that migrate through the solid electrolyte layer 13 to the side of the negative electrode active material layer 14. The lithium ions that have migrated in this manner are received from the negative electrode current collector layer 15 resulting in the deposition of lithium metal on the surface of the negative electrode active material layer 14 on the side of the solid electrolyte layer 13.

On the other hand, when the all-solid-state battery 10 discharges, lithium metal of the negative electrode active material layer 14 dissolves and electrons are emitted into the negative electrode current collector layer 15, resulting in the formation of lithium ions that migrate through the solid electrolyte layer 13 to the side of the positive electrode active material layer 12. The lithium ions that have migrated in this manner are received from the positive electrode current collector layer 11 resulting in the formation an oxide containing lithium in the positive electrode active material layer 12.

Note that, each battery element of the all-solid-state battery 10 of the present embodiment may be formed without providing the negative electrode active material layer 14 at the time of production. In this case, each cell has the positive electrode current collector layer 11, the positive electrode active material layer 12, the solid electrolyte layer 13 and the negative electrode current collector layer 15 laminated in that order at the time of production. When an all-solid-state battery composed in this manner is charged, metal lithium is deposited between the solid electrolyte layer 13 and the negative electrode current collector layer 15 in the manner described above, thereby resulting in formation of the negative electrode active material layer 14.

In addition, when the all-solid-state battery 10 has become completely discharged, there is hardly any lithium metal remaining, and as a result thereof, the negative electrode active material layer 14 becomes extremely thin or is hardly present at all. In this case as well, when the all-solid-state battery 10 is recharged, lithium metal is again deposited between the solid electrolyte layer 13 and the negative electrode current collector layer 15, resulting in formation of the negative electrode active material layer 14. In either case, deposition and dissolution of lithium metal are repeated in the negative electrode active material layer 14 when charging and discharging are repeated in the all-solid-state battery 10 of the present embodiment.

<Properties of All-Solid-State Battery using Lithium Metal>

FIGS. 5A-5C is a schematic cross-sectional view of each cell before and after discharging the all-solid-state battery 10. FIG. 5A shows the status of the cell prior to discharge, while FIGS. 5B and 5C show the status of the cell after discharge. In the status of the cell shown in FIG. 5A, the thickness of the negative electrode active material layer 14 is represented by D1.

In the all-solid-state battery 10 using lithium metal for the negative electrode active material layer 14, lithium metal composing the negative electrode active material layer 14 dissolves as previously described. Dissolution of the negative electrode active material layer 14 proceeds from the side of the surface contacting the solid electrolyte layer 13. In the case output current from the all-solid-state battery 10 is low, namely in the case discharge of the all-solid-state battery 10 is proceeding slowly, dissolution of lithium metal proceeds nearly uniformly over the entire contact surface of the negative electrode active material layer 14. As a result, thickness of the entire negative electrode active material layer 14 decreases uniformly in comparison with prior to discharge as shown in FIG. 5B (D2<D1).

On the other hand, in the case output current from the all-solid-state battery 10 is high, namely in the case discharge of the all-solid-state battery 10 is proceeding rapidly, dissolution of lithium metal locally proceeds rapidly at the contact surface of the negative electrode active material layer 14. Thus, there are regions present on the contact surface of the negative electrode active material layer 14 where dissolution of lithium metal proceeds to a high degree and regions where it proceeds to a low degree. In regions where dissolution proceeds to a high degree, defects X occur in the negative electrode active material layer 14 in the vicinity of the contact surface between the negative electrode active material layer 14 and the solid electrolyte layer 13 as shown in FIG. 5C.

When partial defects X occur in the negative electrode active material layer 14 in the vicinity of the contact surface, lithium ions are no longer conducted through the solid electrolyte layer 13 in those regions where the defects X have formed (and this state is referred to as an ion pathway interruption). Since accumulation of such ion pathway interruptions leads to a decrease in overall battery output, it is necessary to detect these ion pathway interruptions at an early stage.

<Changes Attributable to Pathway Interruptions>

Figure 6:
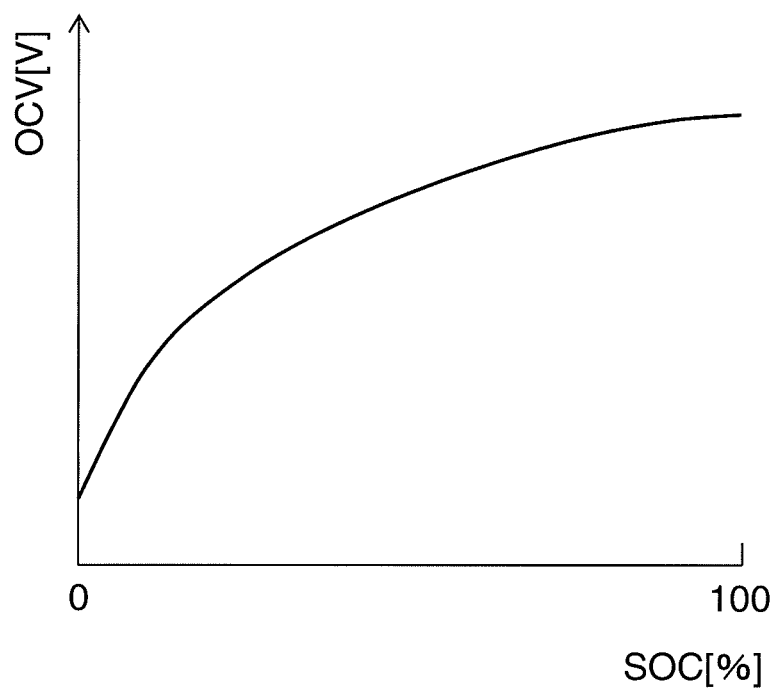
FIG. 6 is a graph showing the correlation between SOC and OCV in an all-solid-state battery.

FIG. 6 is a graph showing the correlation between SOC and OCV in the all-solid-state battery 10. In the all-solid-state battery 10, SOC and OCV are known to have a certain correlation. More specifically, as shown in FIG. 6, when SOC increases, OCV also increases in correlation therewith. This correlation between SOC and OCV remains nearly constant regardless of the temperature of the all-solid-state battery 10. This relationship between SOC and OCV as shown in FIG. 6 is referred to as the standard correlation.

As has been previously described, the voltage calculation unit 56 calculates OCV of the all-solid-state battery 10. Thus, the actual SOC and the OCV calculated by the voltage calculation unit 56 (referred to as the "estimated OCV") basically demonstrate the standard correlation shown in FIG. 6. Consequently, in the case, for example, SOC decreases gradually from a value of 100%, the estimated OCV follows the curve shown in FIG. 6 accompanying a change in SOC.

However, in the case an ion pathway interruption has occurred, the relationship between estimated OCV and SOC does not follow the standard correlation like that shown in FIG. 6. The reason for this is as follows. In the case an ion pathway interruption has occurred, lithium ions become difficult to be conducted through the solid electrolyte layer 13, due to the formation of defects X as previously described, and internal resistance of the all-solid-state battery 10 increases accompanying the formation thereof. As a result, in the case ion pathway interruptions have occurred, CCV decreases in comparison with the absence of the occurrence of ion pathway interruptions.

Here, voltage Vb detected by the voltage sensor 65, or in other words, CCV, is used when estimated OCV is calculated by the voltage calculation unit 56 in the manner described above. In addition, effects of ion pathway interruptions are not taken into consideration when calculating the change in voltage ΔV attributable to internal resistance based on equations (2) and (3). As a result, in the case an ion pathway interruption has occurred, estimated OCV decreases in comparison with the absence of the occurrence of ion pathway interruptions, and thus, the relationship between estimated OCV and SOC no longer demonstrates the standard correlation shown in FIG. 6.

Figure 7:
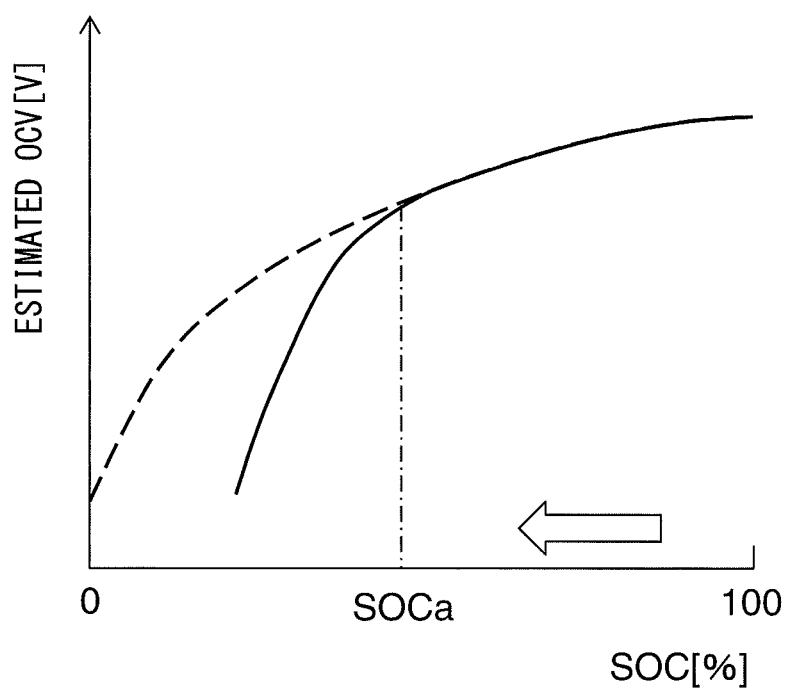
FIG. 7 is a graph showing the relationship between SOC and estimated OCV in the case of the occurrence of an ion pathway interruption.

FIG. 7 shows the relationship between SOC and OCV in the case an ion pathway interruption has occurred. The solid line in the graph indicates the relationship when an ion pathway interruption has occurred, while the broken line indicates the standard correlation (relationship similar to that shown in FIG. 6) when an ion pathway interruption has not occurred. In particular, the solid line of FIG. 7 indicates the relationship in the case an ion pathway interruption occurs when SOC has reached a prescribed value of SOCa, during the course of a gradual decrease in SOC from a value of 100% as indicated by the arrow.

Ion pathway interruptions do not occur during the time SOC decreases from a value of 100% to the prescribed value of SOCa. Consequently, estimated OCV follows the broken line (namely, the curve shown in FIG. 6) accompanying changes in SOC. However, after SOC reaches the prescribed value of SOCa and an ion pathway interruption occurs, estimated OCV decreases rapidly accompanying decreases in SOC. As a result, in the region where SOC is less than the prescribed value of SOCa, estimated OCV is lower than values following the broken line.

<Assessment of Ion Interruptions>

In this manner, in the case an ion pathway interruption has occurred in the all-solid-state battery 10, the correlation between SOC and estimated OCV deviates considerably from the standard correlation when ion pathway interruptions have not occurred in the all-solid-state battery 10. Thus, in such cases, the actual amount of change in SOC and the amount of change in SOC calculated using the standard correlation based on estimated OCV become considerably different from each other. Therefore, in the present embodiment, when the difference between the actual amount of change in SOC and the amount of change in SOC calculated using the standard correlation based on estimated OCV is equal to or greater than a reference value, an ion pathway interruption abnormality is judged to have occurred in the all-solid-state battery 10. The following provides an explanation of this technique used to diagnose abnormalities.

Figure 8:
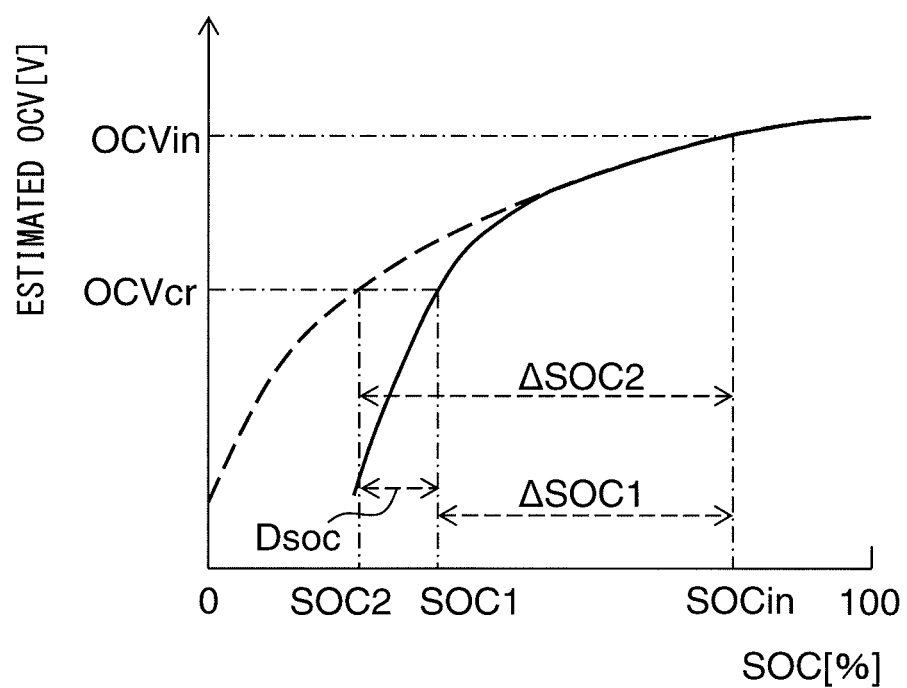
FIG. 8 is a graph, similar to FIG. 7, showing the relationship between SOC and estimated OCV.

FIG. 8 is a graph, similar to FIG. 7, that shows the relationship between SOC and estimated OCV. In the example shown in FIG. 8, there is a certain time at which estimated OCV calculated by the voltage calculation unit 56 is OCVin and the actual SOC is SOCin.

When the all-solid-state battery 10 discharges from this state, SOC decreases accompanying that discharge, resulting in a decrease in estimated OCV. FIG. 8 shows the case in which estimated OCV has reached OCVcr when a prescribed amount of time has elapsed from a certain time.

Here, the amount of change in SOC during this prescribed time period can be calculated using two methods.

In the first method, the amount of change in SOC is calculated by the charging rate calculation unit 55 (and the amount of change in SOC calculated in this manner is also referred to as the "first estimated amount of change ΔSOC1"). More specifically, in the first method, current Ib calculated by the current sensor 66 is integrated during the aforementioned prescribed time period, and the amount of change in SOC is calculated based on this integrated value. Since the integrated value of the current Ib is equal to the amount of electrical charge flowing from the all-solid-state battery 10 and this amount of electrical charge is proportional to the amount of change in SOC, according to this first method, the actual amount of change in SOC can be calculated relatively accurately.

In the second method, estimated OCV calculated by the voltage calculation unit 56 is used. When SOC is calculated using the standard correlation indicated with the broken line in FIG. 8 based on estimated OCV after a prescribed amount of time has elapsed (OCVcr), the calculated SOC becomes SOC2 shown in FIG. 8. Thus, the difference between SOCin and SOC2 can be calculated as the amount of change in SOC during the aforementioned prescribed time period (and the amount of change in SOC calculated in this manner is also referred to as the "second estimated amount of change ΔSOC2").

Here, in the case an ion pathway interruption abnormality has not occurred in the all-solid-state battery 10, the first estimated amount of change ΔSOC1 calculated based on the output of the current sensor 66, and the second estimated amount of change ΔSOC2 calculated based on the output of the voltage sensor 65 (based on estimated OCV), have nearly the same values. However, in the case an ion pathway interruption abnormality has occurred in the all-solid-state battery 10 as indicated with the solid line in FIG. 8, the first estimated amount of change ΔSOC1 calculated based on the output of the current sensor 66, and the second estimated amount of change ΔSOC2 calculated based on the output of the voltage sensor 65, are mutually quite different. The reason for this mutual large difference in the amount of change in SOC is due to having calculated the second estimated amount of change ΔSOC2 based on the standard correlation, despite the relationship between SOC and estimated OCV having deviated from the standard correlation due to the occurrence of an ion pathway interruption as previously described.

Therefore, in the present embodiment, when a difference Dsoc between the second estimated amount of change ΔSOC2 and the first estimated amount of change ΔSOC1 (=|ΔSOC2−ΔSOC1|) is equal to or greater than a predetermined reference value Dsref, the abnormality diagnosis unit 57 judges that the correlation between the amount of change in SOC and estimated OCV has deviated from the standard correlation by an amount equal to or greater than a certain amount, and therefore judges that an ion pathway interruption abnormality has occurred in the all-solid-state battery 10. Conversely, when the difference Dsoc between the amounts of change in SOC is less than the reference value Dsref, the abnormality diagnosis unit 57 judges that the correlation between the amount of change in SOC and estimated OCV has not deviated from the standard correlation by an amount equal to or greater than a certain amount, and therefore judges that an ion pathway interruption abnormality has not occurred in the all-solid-state battery 10.

Figure 9:
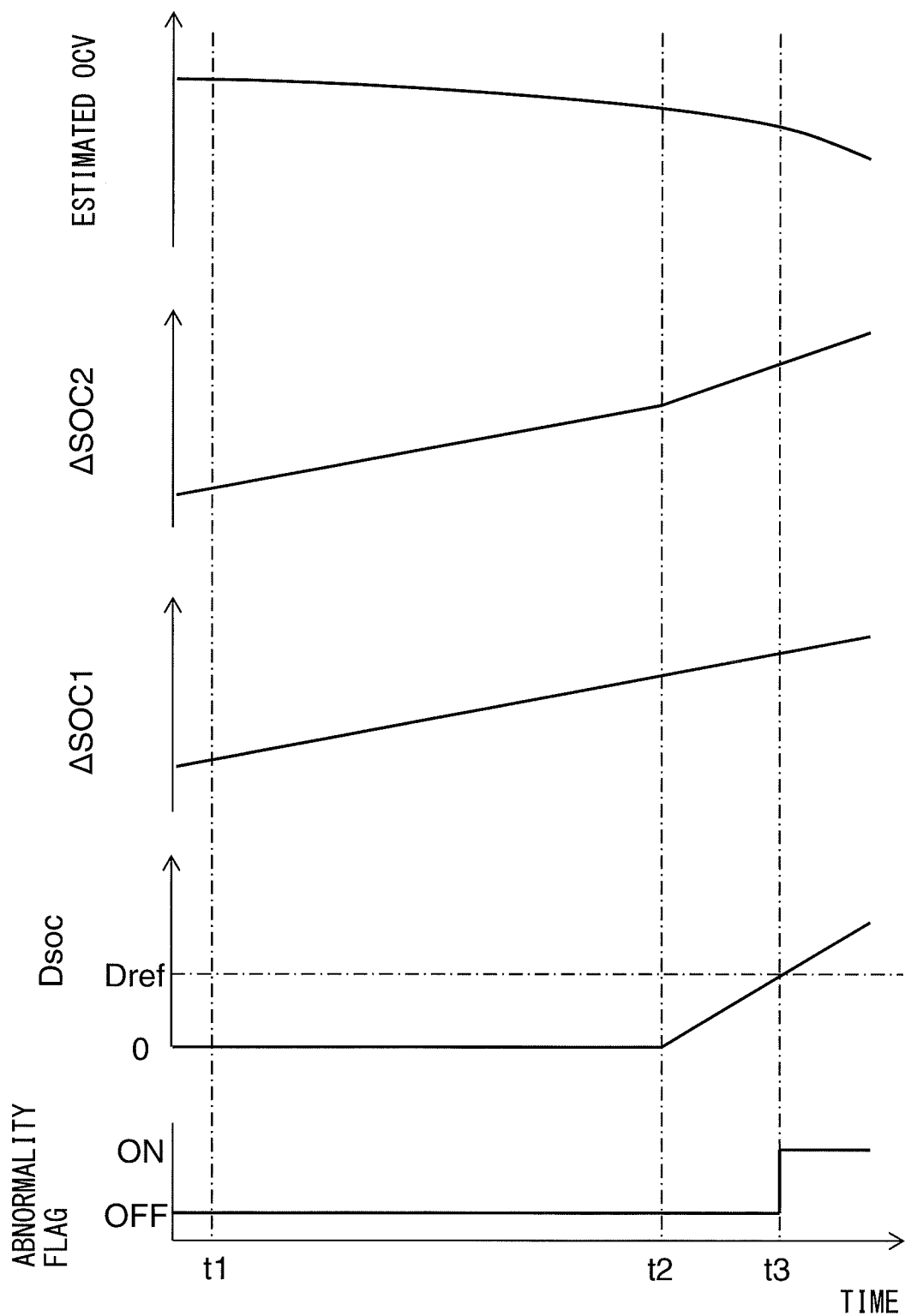
FIG. 9 is a time chart of estimated OCV and other parameters.

FIG. 9 is a time chart of estimated OCV, second estimated amount of change $\Delta$SOC2, first estimated amount of change $\Delta$SOC1, difference Dsoc and an abnormality flag. The abnormality flag is set to ON when an ion pathway interruption abnormality has been judged to have occurred in the all-solid-state battery 10, and is set to OFF at all other times.

In the example shown in FIG. 9, at time t1, estimated OCV is calculated by the voltage calculation unit 56 (equivalent to the initial OCV value, OCVin, of FIG. 8), and SOC at this time is calculated as the initial value of SOC, SOCin, based on the standard correlation between SOC and estimated OCV. Subsequently, estimated OCV decreases accompanying discharge of the all-solid-state battery 10. In addition, the second estimated amount of change $\Delta$SOC2 calculated based on estimated OCV gradually increases due to the decrease in estimated OCV. On the other hand, as discharge of the all-solid-state battery 10 proceeds and the amount of electrical charge flowing from the all-solid-state battery 10 increases, the first estimated amount of change $\Delta$SOC1 calculated by the charging rate calculation unit 55 gradually increases accompanying this increase.

In the example shown in FIG. 9, there are no ion pathway interruptions prior to time t2. Thus, the second estimated amount of change $\Delta$SOC2 and the first estimated amount of change $\Delta$SOC1 increase in the same manner, and thus the difference Dsoc therebetween remains at nearly zero. However, if an ion pathway interruption occurs at time t2, the rate of decrease in estimated OCV increases, resulting in an increase in the rate of increase of the second estimated amount of change $\Delta$SOC2. As a result, the difference Dsoc in the amount of change in SOC gradually increases starting at time t2, and reaches the reference value Dsref at time t3. When the difference Dsoc in the amount of change in SOC reaches the reference value Dsref in this manner, the abnormality diagnosis unit 57 judges that an ion pathway interruption abnormality has occurred in the all-solid-state battery 10, and then the abnormality flag is switched from OFF to ON.

When an ion pathway interruption abnormality is judged to have occurred in the all-solid-state battery 10 by the abnormality diagnosis unit 57 in this manner, the ECU 50 controls each constituent of the vehicle 1 as to limit the output of the all-solid-state battery 10. Since ion pathway interruptions proceed easily in the case the output current from the all-solid-state battery 10 is high as was previously described, ion pathway interruptions can be inhibited from proceeding further by limiting the output of the all-solid-state battery 10. More specifically, the ECU 50 controls the inverter 20 and the motor generator 30 so that the output of the motor generator 30 is equal to or less than a prescribed value.

As was previously explained, in the present embodiment, the abnormality diagnosis unit 57 of the battery control ECU 51 is configured to calculate the amount of change in SOC of the all-solid-state battery 10 as the first estimated amount of change $\Delta$SOC1, based on an integrated value obtained by integrating current detected by the current sensor 66 over a prescribed calculation period (period starting at time t1 in the example shown in FIG. 9), and calculate the amount of change in SOC as the second estimated amount of change $\Delta$SOC2, based on the voltage detected by the voltage sensor 65 during the calculation period. The abnormality diagnosis unit 57 is also configured to judge that an ion pathway interruption abnormality has occurred in the all-solid-state battery 10 when the difference between the first estimated amount of change $\Delta$SOC1 and the second estimated amount of change $\Delta$SOC2 is equal to or greater than a predetermined reference value Dsref. As a result, ion pathway interruptions in the all-solid-state battery 10 can be detected rapidly and accurately.

More specifically, in the present embodiment, the abnormality diagnosis unit 57 calculates the amount of change in SOC during a calculation period as the first estimated amount of change $\Delta$SOC1, without using the standard correlation, based on an integrated value obtained by integrating current detected by the current sensor 66 during the aforementioned calculation period over that calculation period. In addition, the abnormality diagnosis unit 57 calculates the amount of change in SOC over the calculation period as the second estimated amount of change $\Delta$SOC2, using the standard correlation, based on voltage detected by the voltage sensor 65 during that calculation period.

Note that, in the aforementioned present embodiment, abnormality diagnosis is carried out based on an estimated value of the amount of change in SOC. However, abnormality diagnosis may also be carried out based on an amount of change in another charging parameter (amount of parameter change) other than SOC during the aforementioned calculation period, provided that charging parameter changes corresponding to the charge capacity of the all-solid-state battery 10. Examples of such charging parameters include an estimated value of the amount of change in OCV and the amount of electrical charge stored in the all-solid-state battery.

In the case of carrying out abnormality diagnosis based on an estimated value of the amount of change in OCV, if explained with reference to FIG. 12 to be subsequently described, the abnormality diagnosis unit 57 of the battery control ECU 51 is configured for example, to calculate the amount of change in OCV of the all-solid-state battery 10 as a first estimated amount of change $\Delta$OCV1, based on an integrated value obtained by integrating current detected by the current sensor 66 over a calculation period, and to calculate the amount of change in OCV as a second estimated amount of change $\Delta$SOC2, based on voltage detected by the voltage sensor 65 during the calculation period. The abnormality diagnosis unit 57 is configured to judge that an ion pathway interruption abnormality has occurred in the all-solid-state battery 10 when a difference Docv between the first estimated amount of change $\Delta$OCV1 and the second estimated amount of change $\Delta$OCV2 is equal to or greater than a predetermined reference value Doref.

<Flow Chart>

Figure 10:
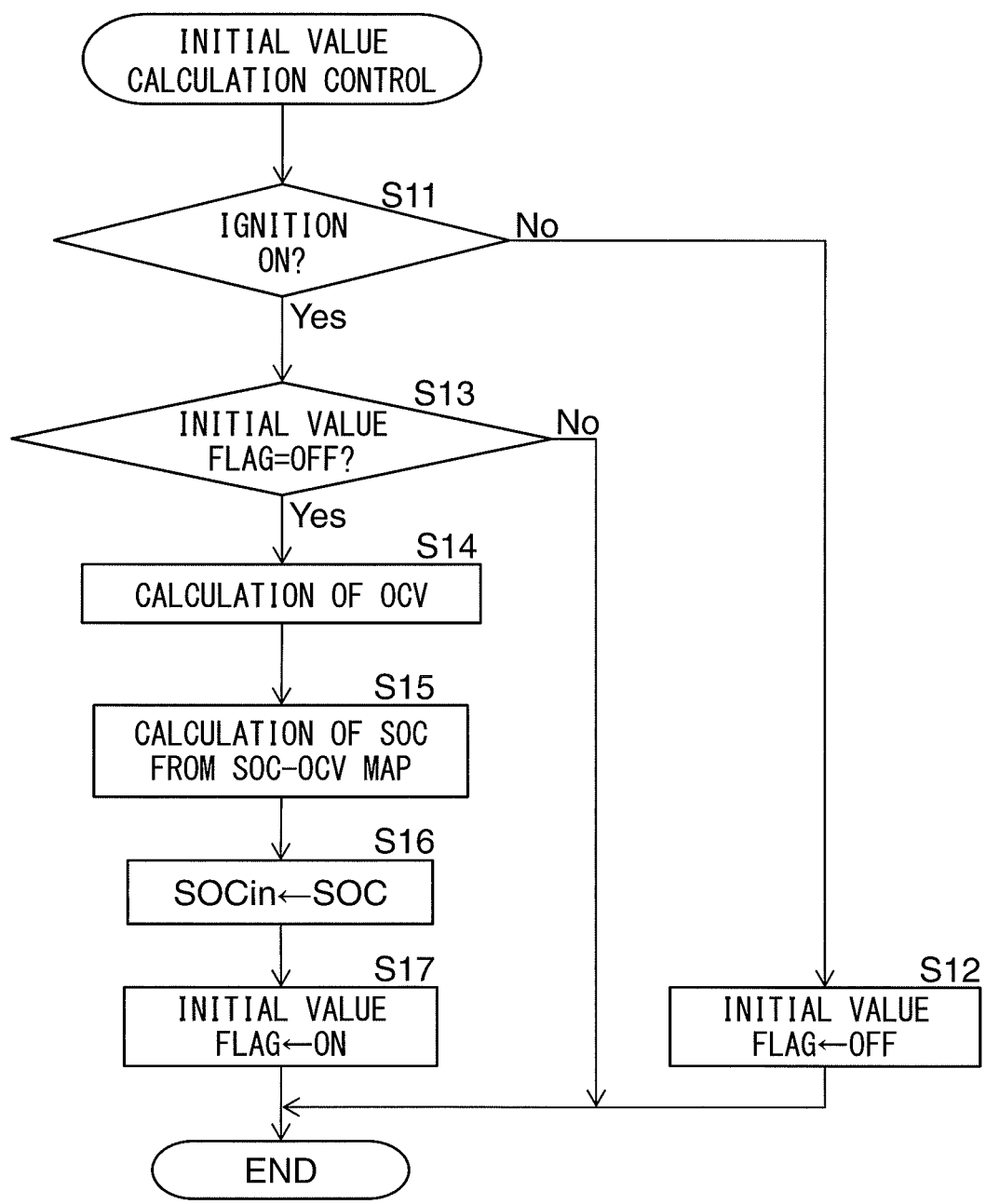
FIG. 10 is a flow chart showing the control routine of control for calculating the initial value of SOC.
Figure 11:
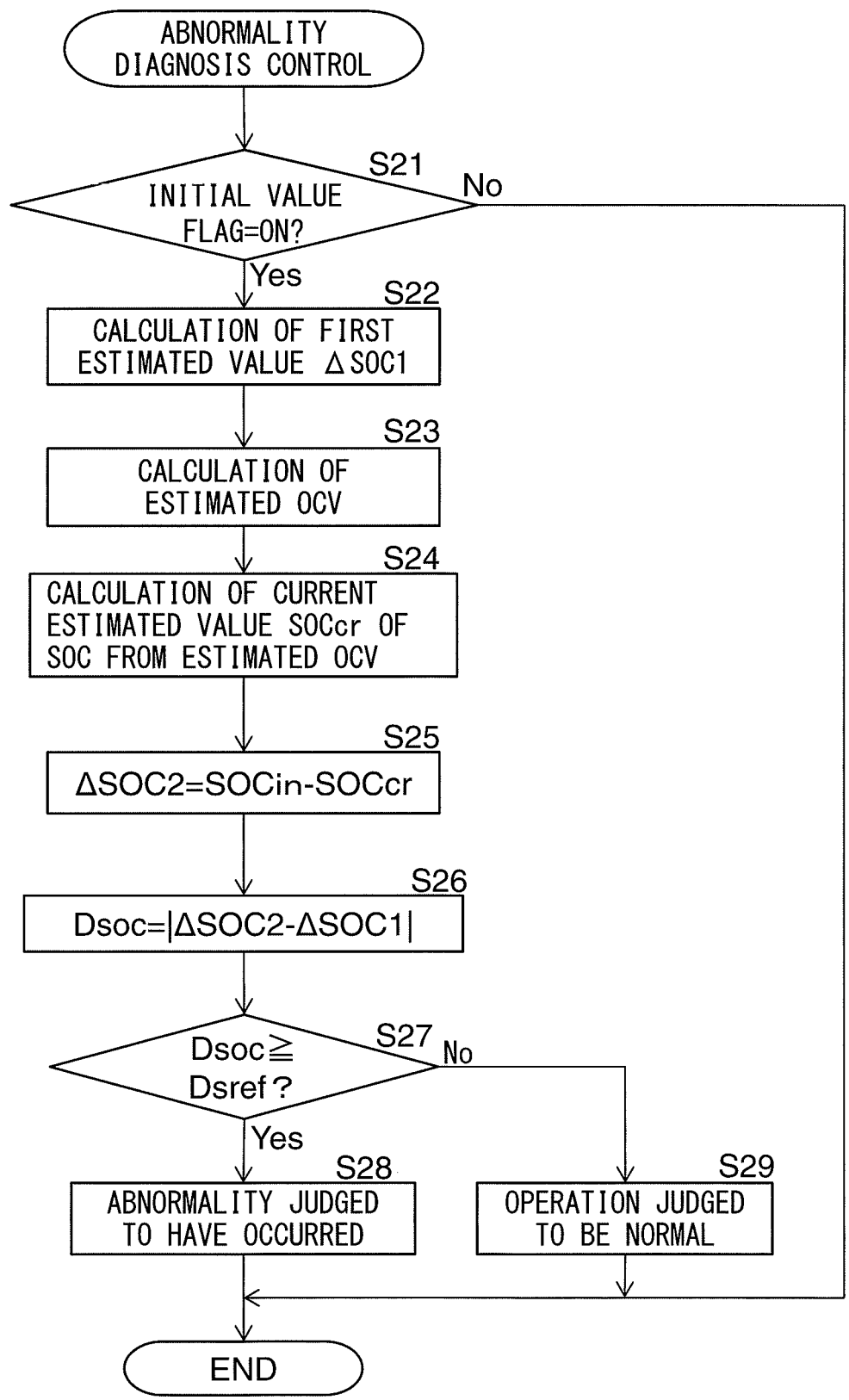
FIG. 11 is a flow chart showing the control routine of control for diagnosing an abnormality in an all-solid-state battery.

The following provides an explanation of a specific example of control during abnormality diagnosis of the all-solid-state battery 10 according to the present embodiment with reference to FIGS. 10 and 11. FIG. 10 is a flow chart showing the control routine of control for calculating the initial value SOCin of SOC. The control routine illustrated in the drawing is executed at a certain time interval by the battery control ECU 51.

First, in Step S11, a judgment is made as to whether or not the ignition switch of the vehicle 1 is ON. In the case the ignition switch has been judged to not be ON, the control routine proceeds to Step S12. In Step S12, the initial value flag is set to OFF. The initial value flag is set to ON when the initial value SOCin of SOC has been set, and is set to OFF at all other times.

Subsequently, when the ignition switch is switched ON, in the subsequent control routine, the control routine proceeds from Step S11 to Step S13. In Step S13, a judgement is made as to whether or not the initial value flag is set to OFF. Since the initial value SOCin of SOC has not been set immediately after having switched the ignition switch ON, the initial value flag is judged to be set to OFF in Step S13, and then the control routine proceeds to Step S14.

In Step S14, estimated OCV is calculated by the voltage detection unit 56. Next, in Step S15, SOC is calculated based on the estimated OCV calculated in Step S14. At this time, an SOC-OCV map representing the standard correlation between SOC and OCV as shown in FIG. 6 is used in calculating SOC. This SOC-OCV map is preliminarily stored in the battery control ECU 51.

Next, in Step S16, the SOC calculated in Step S15 is stored in the battery control ECU 51 as the initial value SOCin of SOC. Subsequently, the initial value flag is set to ON in Step S17.

When the initial value flag is set to ON, the initial value flag is judged to not be OFF in Step S13 in the subsequent control routine, and Steps S14 to S17 are skipped without being executed. Thus, the initial value SOCin is maintained at a fixed value until the ignition switch is switched OFF.

Note that, in the example shown in FIG. 10, the initial value SOCin of SOC is calculated when the ignition switch of the vehicle 1 is switched ON. However, the timing at which the initial value SOCin of SOC is calculated does not necessarily have to be the time when the ignition switch of the vehicle 1 is switched ON. However, if the vehicle 1 is driven by the motor generator 30 of the vehicle 1, there is the possibility of a large current flowing from the all-solid-state battery 10 to the motor generator 30, thereby resulting in the potential for the occurrence of ion pathway interruptions. Thus, the initial value SOCin of SOC is preferably calculated when the vehicle 1 is not driven by the motor generator 30.

Here, the time at which the initial value SOCin of SOC is calculated is equivalent to the starting time of the aforementioned calculation period. Thus, in the present embodiment, the starting time of the aforementioned calculation period is preferably set to time at which the ignition switch of the vehicle 1 is switched ON without the vehicle 1 being driven by the motor generator 30.

In addition, the initial value SOCin of SOC may be periodically updated during the time the ignition switch of the vehicle 1 is ON. In this case, update of the initial value SOCin of SOC is carried out after a certain period of time has elapsed after the previous update and when the vehicle 1 is not being driven by the motor generator 30.

FIG. 11 is a flow chart showing the control routine of control for diagnosing an abnormality in the all-solid-state battery 10. The control routine illustrated in the drawing is executed at a certain time interval by the battery control ECU 51.

As shown in FIG. 11, in Step S21, a judgment is first made as to whether or not the initial value flag is set to ON. The control routine ends when the initial value SOCin of SOC has not been set and the initial value flag is therefore set to OFF. On the other hand, the control routine proceeds to Step S22 when the initial value SOCin of SOC has already been set in Step S21 and the initial value flag is set to ON.

In Step S22, the first estimated amount of change ΔSOC1 is calculated by the charging rate calculation unit 55 after the initial value flag has been set to ON. Since the first estimated amount of change ΔSOC1 is calculated using the time the initial value flag is set to ON as the starting time in this manner, in the present embodiment, the starting time of the aforementioned calculation period can be said to be the time when the initial value flag is set to ON, or in other words, the time when the initial value SOCin of SOC is calculated.

Next, in Step S23, the current estimated OCV is calculated by the voltage calculation unit 56. Next, in Step S24, the current estimated value SOCcr of SOC is calculated, using an SOC-OCV map representing the standard correlation between SOC and OCV as shown in FIG. 6, based on the estimated OCV calculated in Step S23. In Step S25, the difference between the initial value SOCin of SOC calculated in Step S16 of FIG. 10 and the estimated value SOCcr of SOC calculated in Step S24 is calculated as a second estimated amount of change ΔSOC2 (=SOCin−SOCcr). Next, in Step S26, the difference Dsoc between the second estimated amount of change ΔSOC2 calculated in Step S25 and the first estimated amount of change ΔSOC1 calculated in Step S22 is calculated (=|ΔSOC2−ΔSOC1|).

In Step S27, a judgment is made as to whether or not the difference Dsoc between the amounts of change calculated in Step S26 is equal to or greater than a predetermined reference value Dsref. The reference value Dsref is set to a value that is larger than the maximum value of the difference in the amounts of change in SOC able to be attributed to calculation error and the like when an ion pathway interruption has not occurred in the all-solid-state battery 10.

The control routine proceeds to Step S28 in the case the difference Dsoc between the amounts of change in SOC in Step S27 has been judged to be equal to or greater than the reference value Dsref. In Step S28, an ion pathway interruption abnormality is judged to have occurred in the all-solid-state battery 10, thus the abnormality flag is set to ON and the control routine ends. On the other hand, the control routine proceeds to Step S29 in the case the difference Dsoc between the amounts of change in SOC in Step S27 has been judged to be less than the reference value Dsref. In Step S29, the all-solid-state battery 10 is judged to be operating normally and the control routine ends.

Second Embodiment

Figure 12:
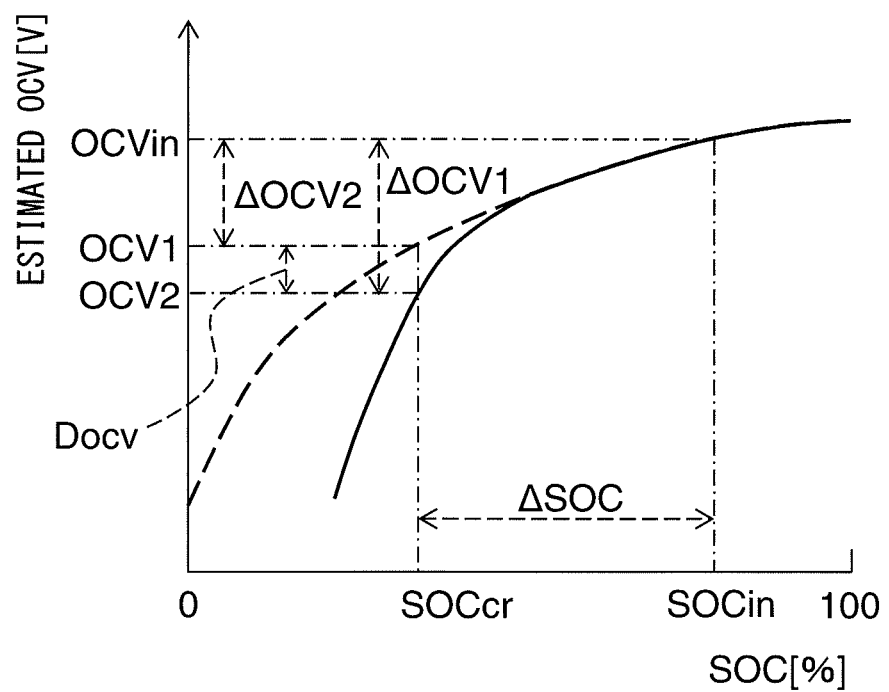
FIG. 12 is a graph, similar to FIG. 8, showing the relationship between SOC and estimated OCV.
Figure 13:
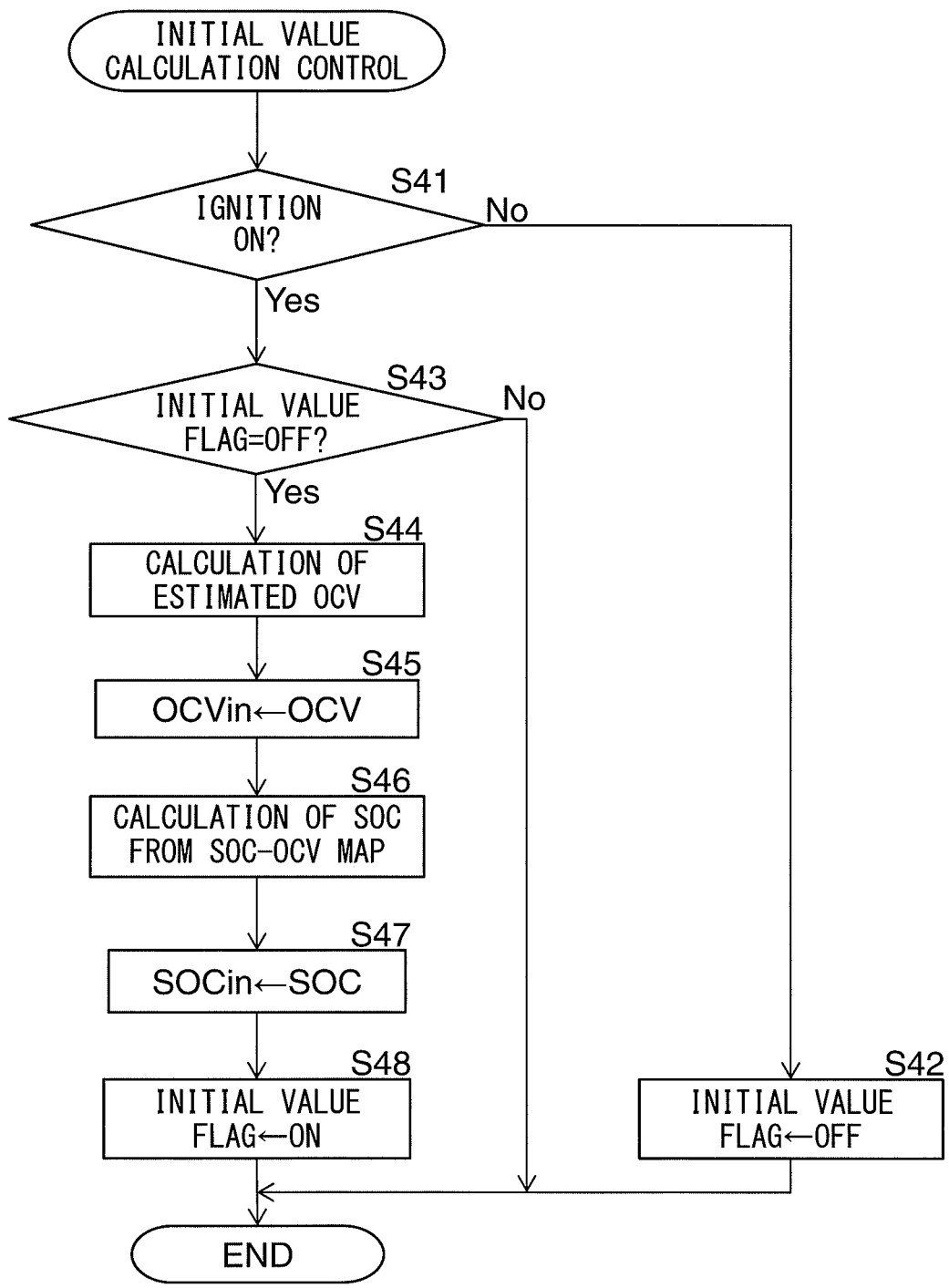
FIG. 13 is a flow chart showing the control routine of control for calculating the initial value of OCV and the initial value of SOC.
Figure 14:
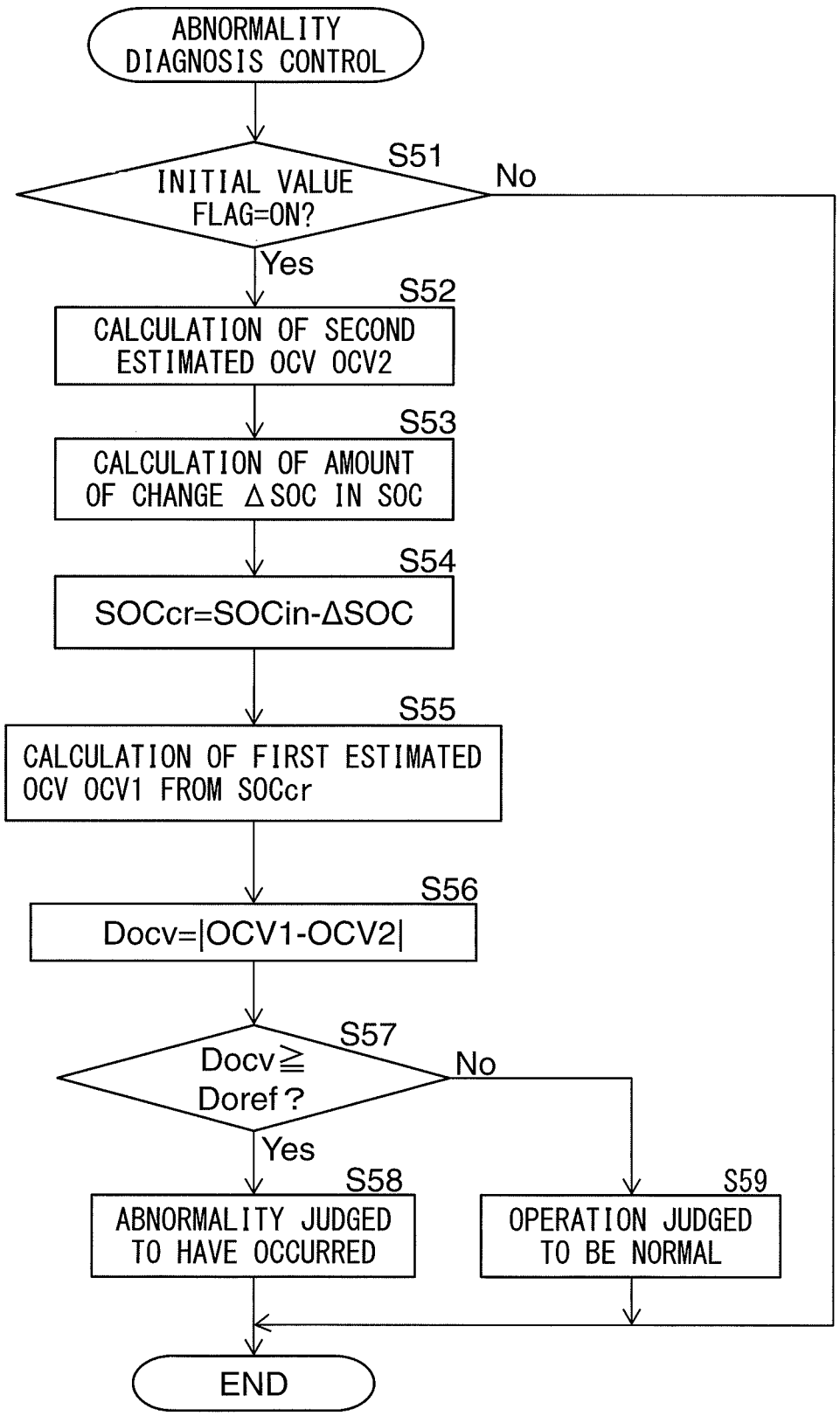
FIG. 14 is a flow chart showing the control routine of control for diagnosing an abnormality in an all-solid-state battery.

Next, an explanation is provided of a vehicle according to a second embodiment with reference to FIGS. 12 to 14. The composition and control of the vehicle according to the second embodiment are basically the same as the composition and control of the vehicle according to the first embodiment. The following provides an explanation of those aspects that differ from the first embodiment.

FIG. 12 is a graph, similar to FIG. 8, showing the relationship between SOC and estimated OCV. In the example shown in FIG. 12 as well, the estimated OCV calculated by the voltage calculation unit 56 at a certain time is OCVin and the actual SOC is SOCin. In this case, OCV after a certain amount of time has elapsed from a certain time can be calculated by two methods.

The first method uses the amount of change ΔSOC in SOC calculated by the charging rate calculation unit 55. When this amount of change ΔSOC in SOC is used, SOC after a prescribed amount of time has elapsed can be calculated as SOCcr obtained by subtracting ΔSOC from SOCin. (SOCcr=SOCin−ΔSOC). Estimated OCV after a prescribed amount of time has elapsed can be calculated, using the standard correlation indicated with the broken line in FIG. 12, based on SOCcr, which is SOC after a prescribed amount of time has elapsed, calculated as above (and the estimated OCV calculated in this manner is also referred to as the "first estimated OCV OCV1").

In the second method, estimated OCV after a prescribed amount of time has elapsed is calculated by the voltage detection unit 56 (and the estimated OCV calculated in this manner is also referred to as the "second estimated OCV OCV2").

The first estimated OCV OCV1 (equivalent to OCV1 in FIG. 12) and the second estimated OCV OCV2 (equivalent to OCV2 in FIG. 12) calculated in this manner are nearly equal in the case ion pathway interruption abnormalities have not occurred in the all-solid-state battery 10. However, the first estimated OCV and the second estimated OCV exhibit considerably different values in the case an ion pathway interruption abnormality has occurred in the all-solid-state battery 10, as indicated with the solid line in FIG. 12.

Therefore, in the present embodiment, when a difference Docv between the first estimated OCV and the second estimated OCV is equal to or greater than a predetermined reference value Doref, the abnormality diagnosis unit 57 judges that an ion pathway interruption abnormality has occurred in the all-solid-state battery 10. Conversely, when the difference Docv is less than the reference value Doref, the abnormality diagnosis unit 57 judges that an ion pathway interruption abnormality has not occurred in the all-solid-state battery 10.

Note that, abnormality diagnosis is carried out based on estimated OCV in the aforementioned embodiment. However, abnormality diagnosis may also be carried out based on the value of another charging parameter other than OCV provided that charging parameter changes corresponding to the charge capacity of the all-solid-state battery 10. Examples of such charging parameters include estimated SOC and the amount of electrical charge stored in the all-solid-state battery.

In the case of carrying out abnormality diagnosis based on estimated SOC, when explained with reference to FIG. 8, the abnormality diagnosis unit 57 of the battery control ECU 51 is configured, for example, to calculate SOC of the all-solid-state battery 10 as a first estimated SOC SOC1, based on an integrated value obtained by integrating current detected by the current sensor 66 over a calculation period, and to calculate SOC as a second estimated SOC SOC2, based on voltage detected by the voltage sensor 65 during the calculation period. The abnormality diagnosis unit 57 is configured to judge that an ion pathway interruption abnormality has occurred in the all-solid-state battery 10 when a difference Dsoc between the first estimated SOC SOC1 and the second estimated SOC SOC2 is equal to or greater than a predetermined reference value Dsref.

<Flow Chart>

The following provides an explanation of a specific example of control during abnormality diagnosis of the all-solid-state battery 10 according to the second embodiment, with reference to FIGS. 13 and 14.

FIG. 13 is a flow chart showing the control routine of control for calculating the initial value OCVin of OCV and the initial value SOCin of SOC. The control routine illustrated in the drawing is executed at a certain time interval by the battery control ECU 51. Note that, since Steps S41 to S44 and Steps S46 to S48 of FIG. 13 are the same as Steps S11 to S17 of FIG. 10, an explanation thereof is omitted. In Step S45, the OCV calculated in Step S44 is stored in the battery control ECU 51 as initial value OCVin of OCV.

FIG. 14 is a flow chart showing the control routine of control for diagnosing an abnormality in the all-solid-state battery 10. The control routine illustrated in the drawing is executed at a certain time interval by the battery control ECU 51.

As shown in FIG. 14, in Step S51, a judgment is first made as to whether or not the initial value flag is set to ON. The control routine ends when the initial value flag is set to OFF. On the other hand, the control routine proceeds to Step S52 when the initial value flag is set to ON in Step S51.

In Step S52, the second estimated OCV OCV2 is calculated by the voltage calculation unit 56. Next, in Step S53, the amount of change in SOC ΔSOC after the initial value flag has been set to ON, is calculated by the charging rate calculation unit 55.

Next, in Step S54, the current estimated SOC SOCcr is calculated by subtracting the amount of change in SOC ΔSOC calculated in Step S53 from the initial value SOCin of SOC calculated in Step S47 of FIG. 13 (SOCcr=SOCin−ΔSOC). In Step S55, the first estimated OCV OCV1 is calculated using the SOC-OCV map representing the standard correlation between SOC and OCV as shown in FIG. 6, based on the current estimated SOC SOCcr calculated in Step S54. Next, in Step S56, the difference Docv is calculated between the first estimated OCV OCV1 calculated in Step S55 and the second estimated OCV OCV2 calculated in Step S52 (=|OCV1−OCV2|).

In Step S56, a judgment is made as to whether or not the difference Docv between the estimated OCV values calculated in Step S55 is equal to or greater than the predetermined reference value Doref. The reference value Doref is set to a value that is larger than the maximum value of the difference in the estimated OCV values able to be attributed to calculation error and the like when an ion pathway interruption has not occurred in the all-solid-state battery 10.

The control routine proceeds to Step S58 in the case the difference Docv between estimated OCV values in Step S57 is equal to or greater than the reference value Doref. In Step S58, an ion pathway interruption abnormality is judged to have occurred in the all-solid-state battery 10 and the control routine ends. On the other hand, the control routine proceeds to Step S59 in the case the difference Docv between the estimated OCV values in Step S57 has been judged to be less than the reference value Doref. In Step S59, the all-solid-state battery 10 is judged to be operating normally and the control routine ends.

Third Embodiment

Figure 15:
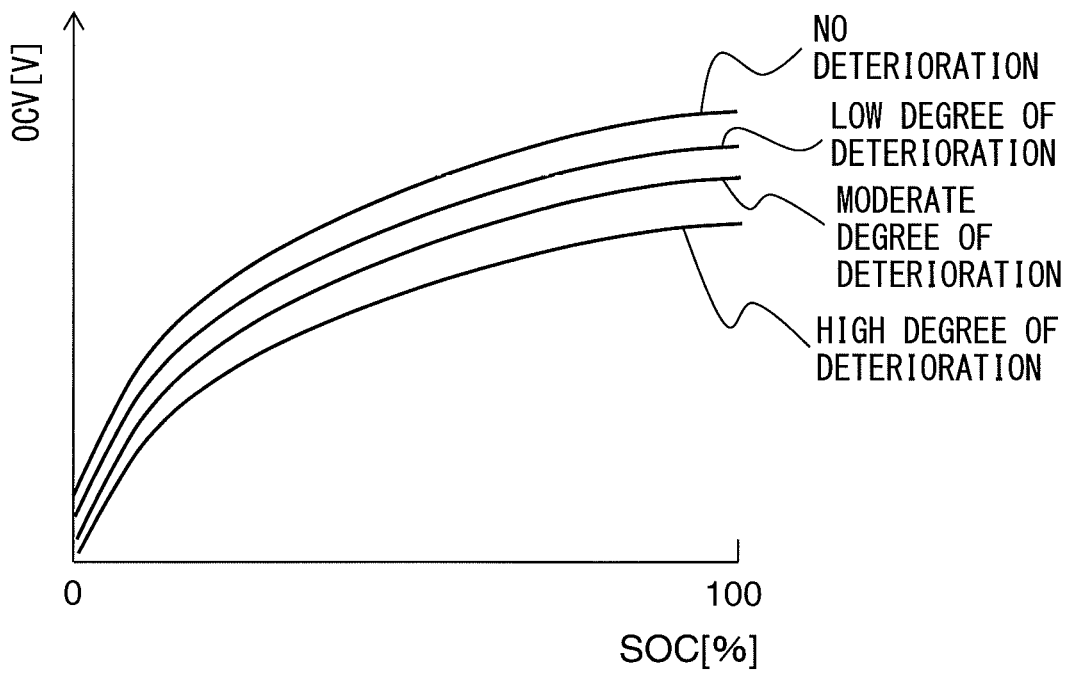
FIG. 15 is a graph showing changes in the correlation between SOC and OCV corresponding to deterioration.
Figure 16:
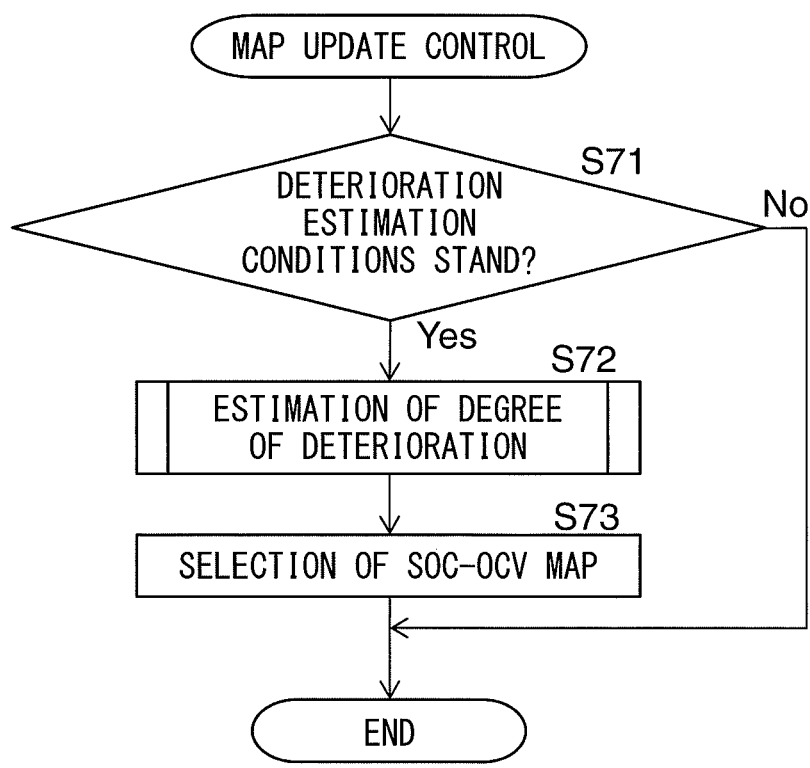
FIG. 16 is a flow chart showing the control routine of control for updating an SOC-OCV map.

Next, an explanation is provided of a vehicle according to a third embodiment with reference to FIGS. 15 and 16. The composition and control of the vehicle according to the third embodiment are basically the same as the composition and control of the vehicles according to the first embodiment and second embodiment. The following provides an explanation focusing primarily on those aspects that differ from the first embodiment and second embodiment.

When the all-solid-state battery 10 deteriorates, the relationship between SOC and OCV shown in FIG. 6 is known to change gradually corresponding thereto. This deterioration occurs, for example, as a result of a portion of the all-solid-state battery 10 undergoing a chemical change due to repeated charging and discharging thereby preventing lithium from migrating.

More specifically, as deterioration of the all-solid-state battery 10 proceeds in this manner, the standard correlation between SOC and OCV changes such that OCV gradually decreases relative to the same SOC. However, the rate of change in the standard correlation between SOC and OCV accompanying deterioration of the all-solid-state battery 10 is slower in comparison with the rate of change of the relationship between SOC and OCV accompanying occurrence of the previously described ion pathway interruptions.

Therefore, in the third embodiment, the battery control ECU 51 estimates the degree of deterioration of the all-solid-state battery 10 and updates the standard correlation in accordance with the degree of deterioration of the all-solid-state battery 10.

More specifically, standard correlations between SOC and OCV corresponding to the degree of deterioration of the all-solid-state battery 10 are preliminary stored in the battery control ECU 51 in the form of maps (such as an SOC-OCV map corresponding to each degree of deterioration as shown in FIG. 15) or calculation formulas. During the course of use of the all-solid-state battery 10, in addition to estimating the degree of deterioration of the all-solid-state battery 10, the standard correlation corresponding to a particular degree of deterioration is selected from among the standard correlations stored in the battery control ECU 51, and the selected standard correlation is used to diagnose abnormalities in the all-solid-state battery 10.

Various methods known in the prior art can be used to estimate the degree of deterioration of the all-solid-state battery 10. The following provides a brief explanation of an example of a method used to estimate the degree of deterioration of the all-solid-state battery 10.

As the degree of deterioration of the all-solid-state battery 10 increases, the full charge capacity of the all-solid-state battery 10 is known to decrease accompanying that increase. Thus, estimating the full charge capacity of the all-solid-state battery 10 makes it possible to estimate the degree of deterioration of the all-solid-state battery 10. The full charge capacity Qfull of the all-solid-state battery 10 is calculated by, for example, calculating the amount of change $\Delta$SOC in SOC using a standard correlation stored in the battery control ECU 51, based on the change in OCV accompanying charging, when the all-solid-state battery 10 is charged from the outside, and calculating an integrated current $\Sigma$I obtained by integrating charging current during charging, using the following equation (4) based on these values of $\Delta$SOC and $\Sigma$I.

$$Q\text{full}=\Sigma I/\Delta SOC\times 100 \tag{4}$$

In addition, examples of factors affecting deterioration of the all-solid-state battery 10 include the total usage time of the all-solid-state battery 10, temperature transitions of the all-solid-state battery 10 and SOC transitions. Thus, the degree of deterioration of the all-solid-state battery 10 can be calculated using a model equation such as a degree of deterioration calculation model, based on such factors as the total usage time of the all-solid-state battery 10, temperature transitions of the all-solid-state battery 10 or SOC transitions.

FIG. 16 is a flow chart showing the control routine of control for controlling updating of an SOC-OCV map. The control routine illustrated in the drawing is executed at a certain time interval.

As shown in FIG. 16, in Step S71, a judgment is first made as to whether or not conditions for executing estimation of the degree of deterioration of the all-solid-state battery 10 (to be referred to as "deterioration estimation execution conditions") stand. Deterioration estimation execution conditions stand when, for example, the all-solid-state battery 10 is being charged from the outside or in the case a certain amount of time has elapsed from the previous estimation of the degree of deterioration. The control routine ends in the case deterioration estimation execution conditions are judged to not stand in Step S71. On the other hand, the control routine proceeds to Step S72 in the case the deterioration estimation execution conditions have been judged to stand.

In Step S72, the degree of deterioration is estimated according to a method like that described above. Next, in Step S73, an SOC-OCV map corresponding to the degree of deterioration is selected from among SOC-OCV maps stored in the battery control ECU 51, based on the degree of deterioration estimated in Step S72, and then the control routine ends. The SOC-OCV map selected in Step S73 is used in Step S15 of FIG. 10, Step S24 of FIG. 11, Step S46 of FIG. 13, and Step S55 of FIG. 14.

Fourth Embodiment

Figure 17:
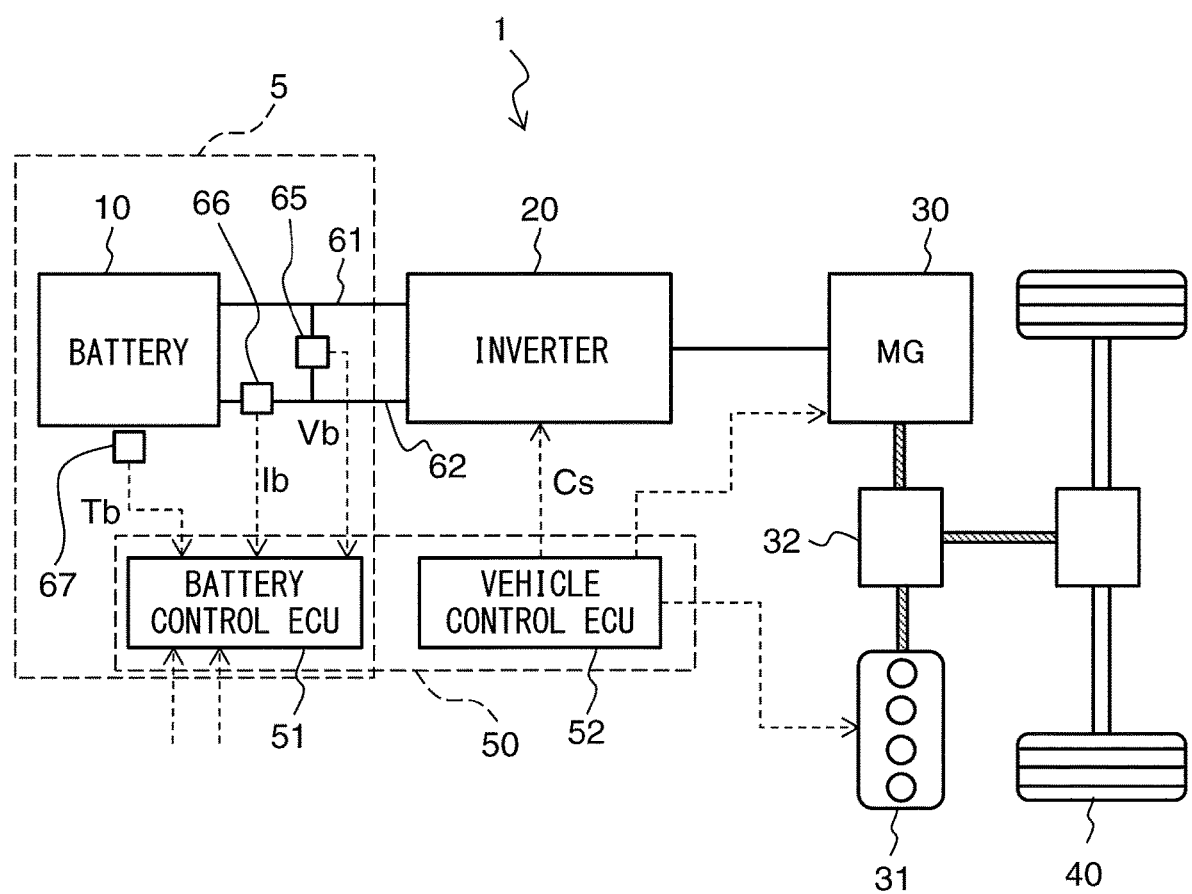
FIG. 17 is a block diagram schematically representing the composition of the power train of a vehicle according to a fourth embodiment.

Next, an explanation is provided of a vehicle according to the fourth embodiment with reference to FIG. 17. The composition and control of the vehicle according to the fourth embodiment are basically the same as the composition and control of the vehicles according to the first to third embodiments. The following provides an explanation focusing primarily on those aspects that differ from the first to third embodiments.

FIG. 17 is a block diagram schematically representing the composition of the power train of a vehicle 1 according to the fourth embodiment. The vehicle 1 of the fourth embodiment is a hybrid vehicle provided with a motor generator and internal combustion engine as motive power sources. As shown in FIG. 17, the vehicle 1 of the present embodiment is provided with an internal combustion engine 31 and a power distribution device 32 in addition to constituents of the vehicle of the first embodiment.

The internal combustion engine 31 is a device for generating motive power by burning a fuel. Motive power obtained from the internal combustion engine 31 is used to drive the wheels 40 as well as generate electricity in the motor generator 30. The power distribution device 32 is mechanically coupled to the motor generator 30, the internal combustion engine 31 and the wheels 40 through shafts and gears, and motive power is distributed thereamong. The power distribution device 32 is composed with planetary gears, for example.

In the vehicle 1 composed in this manner, when an ion pathway interruption abnormality has been judged to have occurred in the all-solid-state battery 10 by the abnormality diagnosis unit 57, the ECU 50 may control each constituent of the vehicle 1 so as to charge the all-solid-state battery 10. When the all-solid-state battery 10 is charged while in a state in which an ion pathway interruption is occurring, lithium metal is deposited in regions where there are defects X as previously described, thereby making it possible to eliminate the ion pathway interruptions. More specifically, in addition to enhancing output of the internal combustion engine 31 so as to be able to drive the vehicle 1 as well as generate electricity with the motor generator 30, the ECU 50 controls the internal combustion engine 31, the inverter 20 and the motor generator 30 so that the all-solid-state battery 10 is charged by power generation of the motor generator 30.

Note that, the vehicle 1 of the present embodiment is provided with the internal combustion engine 31 in order to serve as an apparatus capable of generating electricity for charging the all-solid-state battery 10. However, the vehicle 1 may be provided with another apparatus such as a fuel cell instead of the internal combustion engine 31 provided that apparatus is capable of generating electricity.

The invention claimed is:

1. A battery system, comprising:
an all-solid-state battery at least having one battery element obtained by laminating a positive electrode current collector layer, a positive electrode active material layer, a solid electrolyte layer, a negative electrode current collector layer and a negative electrode active material layer in an order of the positive electrode current collector layer, the positive electrode active material layer, the solid electrolyte layer, the negative electrode current collector layer, and the negative electrode active material layer;
a voltage detection device that detects voltage of the all-solid-state battery:
a current detection device that detects current flowing from the all-solid-state battery; and
a control device that controls the all-solid-state battery, wherein,
the negative electrode active material is composed of lithium metal, and
when an amount of change during a prescribed calculation period in a charging parameter that changes corresponding to a charge capacity of the all-solid-state battery is defined as the amount of change of the parameter, the control device is configured to calculate a first amount of change in the parameter as a first estimated value, based on an integrated value obtained by integrating the current detected by the current detection device over the prescribed calculation period, to calculate a second amount of change in the parameter as a second estimated value based on the voltage detected by the voltage detection device during the prescribed calculation period, and to judge that an abnormality has occurred in the all-solid-state battery when a difference between the first estimated value and the second estimated value is equal to or greater than a predetermined reference value.

2. A battery system, comprising:
an all-solid-state battery at least having one battery element obtained by laminating a positive electrode current collector layer, a positive electrode active material layer, a solid electrolyte layer, a negative electrode current collector layer and a negative electrode active material layer, in an order of the positive electrode current collector layer, the positive electrode active material layer, the solid electrolyte layer, the negative electrode current collector layer, and the negative electrode active material layer;
a voltage detection device that detects voltage of the all-solid-state battery;
a current detection device that detects current flowing from the all-solid-state battery; and
a control device that controls the all-solid-state battery, wherein,
the negative electrode active material is composed of lithium metal, and
the control device is configured to calculate a value of a charging parameter, that changes corresponding to a charge capacity of the all-solid-state battery, when a prescribed calculation period has elapsed, as a first estimated value, based on an integrated value obtained and based on the voltage detected by the voltage detection device when the prescribed calculation period begins, by integrating the current detected by the current detection device over the prescribed calculation period, to calculate the value of the charging parameter when the prescribed calculation period has elapsed, as a second estimated value, based on the voltage detected by the voltage detection device during the prescribed calculation period, and to judge that an abnormality has occurred in the all-solid-state battery when a difference between the first estimated value and the second estimated value is equal to or greater than a predetermined reference value.

3. The battery system according to claim 1, wherein the control device is configured to calculate one of the first estimated value and the second estimated value, using a standard correlation, which represents a relationship between a charging rate of the all-solid state battery and an open circuit voltage of the all-solid-state battery when an ion pathway interruption abnormality is not occurring in the all-solid-state battery, and to calculate the other of the first estimated value and the second estimated value without using the standard correlation.

4. The battery system according to claim 2, wherein the control device is configured to calculate one of the first estimated value and the second estimated value, using a standard correlation, which represents a relationship between a charging rate of the all-solid state battery and an open circuit voltage of the all-solid-state battery when an ion pathway interruption abnormality is not occurring in the all-solid-state battery, and to calculate the other of the first estimated value and the second estimated value without using the standard correlation.

5. The battery system according to claim 3, wherein the control device is configured to update the standard correlation according to a degree of deterioration of the all-solid-state battery.

6. The battery system according to claim 4, wherein the control device is configured to update the standard correlation according to a degree of deterioration of the all-solid-state battery.

7. The battery system according to claim 1, wherein the charging parameter is a charging rate of the all-solid-state battery.

8. The battery system according to claim 2, wherein the charging parameter is a charging rate of the all-solid-state battery.

9. The battery system according to claim 1, wherein the charging parameter is an open circuit voltage of the all-solid-state battery.

10. The battery system according to claim 2, wherein the charging parameter is an open circuit voltage of the all-solid-state battery.

11. A vehicle equipped with the battery system according to claim 1, comprising a motor for driving the vehicle, wherein
the all-solid-state battery is connected to the motor, and
a starting time of the prescribed calculation period is a time at which a vehicle ignition switch of the vehicle is ON and the vehicle is not being driven by the motor.

12. A vehicle equipped with the battery system according to claim 2, comprising a motor for driving the vehicle, wherein
the all-solid-state battery is connected to the motor, and
a starting time of the prescribed calculation period is a time at which a vehicle ignition switch of the vehicle is ON and the vehicle is not being driven by the motor.

13. A vehicle equipped with the battery system according to claim 1, comprising a vehicle control device that controls each of a plurality of constituents of the vehicle, wherein
the vehicle control device is configured to control the plurality of constituents so that output of the all-solid-state battery is restricted, when an abnormality has been judged to have occurred in the all-solid-state battery, in comparison with when the abnormality has been judged to not have occurred.

14. A vehicle equipped with the battery system according to claim 2, comprising a vehicle control device that controls each of a plurality of constituents of the vehicle, wherein
the vehicle control device is configured to control the plurality of constituents so that output of the all-solid-state battery is restricted, when an abnormality has been judged to have occurred in the all-solid-state battery, in comparison with when the abnormality has been judged to not have occurred.

15. A vehicle equipped with the battery system according to claim 1, comprising a vehicle control device that controls each of a plurality of constituents of the vehicle, wherein
the vehicle control device is configured to control the plurality of constituents so that the all-solid-state battery is charged when an abnormality has been judged to have occurred in the all-solid-state battery.

16. A vehicle equipped with the battery system according to claim 2, comprising a vehicle control device that controls each of a plurality of constituents of the vehicle, wherein
the vehicle control device is configured to control the plurality of constituents so that the all-solid-state battery is charged when an abnormality has been judged to have occurred in the all-solid-state battery.

\* \* \* \* \*